(12) United States Patent
Stasiw et al.

(10) Patent No.: US 11,508,715 B2
(45) Date of Patent: Nov. 22, 2022

(54) LIGHT-EMITTING DIODE CHIP WITH ELECTRICAL OVERSTRESS PROTECTION

(71) Applicant: CreeLED, Inc., Durham, NC (US)

(72) Inventors: Daniel E. Stasiw, Durham, NC (US); Steven Wuester, Wake Forest, NC (US); Michael Check, Apex, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/857,721

(22) Filed: Apr. 24, 2020

(65) Prior Publication Data

US 2021/0336093 A1 Oct. 28, 2021

(51) Int. Cl.
| | | |
|---|---|---|
| *H01L 27/02* | (2006.01) | |
| *H01L 33/48* | (2010.01) | |
| *H01L 33/60* | (2010.01) | |
| *H01L 33/00* | (2010.01) | |
| *H01L 25/075* | (2006.01) | |
| *H01L 33/62* | (2010.01) | |

(52) U.S. Cl.
CPC ...... *H01L 27/0248* (2013.01); *H01L 25/0753* (2013.01); *H01L 33/0016* (2013.01); *H01L 33/483* (2013.01); *H01L 33/60* (2013.01); *H01L 33/62* (2013.01); *H01L 2224/8011* (2013.01); *H01L 2224/8111* (2013.01); *H01L 2224/8211* (2013.01); *H01L 2224/8511* (2013.01)

(58) Field of Classification Search
CPC ..... H01L 33/0016; H01L 33/60; H01L 33/62; H01L 23/60; H01L 27/0248; H01L 2224/8011; H01L 2224/8111; H01L 2224/8211; H01L 2224/8511
See application file for complete search history.

(56) References Cited

U.S. PATENT DOCUMENTS

| | | | |
|---|---|---|---|
| 8,866,169 B2 | 10/2014 | Emerson et al. | |
| 9,070,850 B2 | 6/2015 | Keller et al. | |
| 9,461,201 B2 | 10/2016 | Heikman et al. | |
| 9,887,327 B2 | 2/2018 | Reiherzer et al. | |
| 10,236,414 B2 | 3/2019 | Lee et al. | |
| 10,468,565 B2 | 11/2019 | Pun et al. | |
| 2004/0075399 A1* | 4/2004 | Hall | H01L 25/0753 315/291 |
| 2005/0274956 A1 | 12/2005 | Bhat | |

(Continued)

*Primary Examiner* — Feifei Yeung Lopez
(74) *Attorney, Agent, or Firm* — Withrow & Terranova, P.L.L.C.

(57) ABSTRACT

Solid-state lighting devices including light-emitting diodes (LEDs) and more particularly LED chip structures with electrical overstress protection are disclosed. LED chip structures are disclosed that include built-in electrical overstress protection. An exemplary LED chip may include an active LED structure that is arranged as a primary light-emitting structure and a separate active LED structure that is arranged as an electrical overstress protection structure. The electrical overstress protection structure may be electrically connected in reverse relative to the primary light-emitting structure. In this manner, under normal operating conditions, forward current will flow through the primary light-emitting structure to generate desired light emissions, and during an electrical overstress event, reverse current may flow through the electrical overstress protection structure, thereby protecting the light-emitting structure from damage.

25 Claims, 14 Drawing Sheets

(56) References Cited

U.S. PATENT DOCUMENTS

| | | | | |
|---|---|---|---|---|
| 2007/0284598 A1* | 12/2007 | Shakuda | ............... | H01L 27/156 |
| | | | | 257/93 |
| 2008/0211416 A1* | 9/2008 | Negley | ................. | H05B 45/30 |
| | | | | 315/193 |
| 2011/0121425 A1* | 5/2011 | Yannou | ................... | H01L 23/60 |
| | | | | 257/516 |
| 2011/0260205 A1* | 10/2011 | Moosburger | .......... | H01L 33/005 |
| | | | | 257/99 |
| 2012/0025249 A1* | 2/2012 | Jeong | ..................... | H01L 27/15 |
| | | | | 257/98 |
| 2016/0218096 A1* | 7/2016 | Lee | ..................... | H01L 27/0255 |
| 2017/0098746 A1 | 4/2017 | Bergmann et al. | | |
| 2018/0145216 A1* | 5/2018 | Lee | ........................ | H01L 33/06 |
| 2018/0254386 A1 | 9/2018 | Perzlmaier et al. | | |

* cited by examiner

LIGHT-EMITTING DIODE CHIP WITH ELECTRICAL OVERSTRESS PROTECTION

FIELD OF THE DISCLOSURE

The present disclosure relates to solid-state lighting devices including light-emitting diodes (LEDs) and more particularly to LED chip structures with electrical overstress protection.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials.

Electrical overstress events occur when an LED is exposed to a current or voltage that exceeds a maximum operating current or voltage for which the LED is rated. Depending on the duration and amplitude of the exposure, the effect on the LED can vary in severity. In many instances, electrical overstress events can cause damage to the LED, either as an immediate failure or a gradual failure and/or performance degradation over many hours after exposure. Electrostatic discharge (ESD) is a widely recognized electrical overstress hazard for LEDs that may occur during manufacturing, shipping and handling when the LED is subjected to a very short and high electrical pulse. One troublesome aspect is that ESD events sometimes do not cause an immediate catastrophic failure. Instead, ESD events can cause latent failures that become catastrophic hundreds or thousands of operating hours later. In packaged LED components, it can be common to include a separate electrical overstress chip, such as a Zener diode or ESD chip, to provide protection against electrical overstress events such as ESD.

As advancements in modern LED technology progress, the art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to LED chip structures with electrical overstress protection. LED chip structures are disclosed that include built-in electrical overstress protection. An exemplary LED chip may include an active LED structure that is arranged as a primary light-emitting structure and a separate active LED structure that is arranged as an electrical overstress protection structure. The separate active LED structure that forms the electrical overstress protection structure may be electrically connected in reverse relative to the active LED structure that forms the primary light-emitting structure. In this manner, under normal operating conditions, forward current will flow through the primary light-emitting structure to generate desired light emissions and during an electrical overstress event, reverse current may flow through the electrical overstress protection structure, thereby protecting the primary light-emitting structure from damage.

In one aspect, an LED chip comprises: a first active LED structure that comprises a first n-type layer, a first p-type layer, and a first active layer; and a second active LED structure that comprises a second n-type layer, a second p-type layer, and a second active layer, the second active LED structure is electrically coupled in reverse relative to the first active LED structure. In certain embodiments, the first active LED structure forms a light-emitting structure that is electrically coupled for forward biasing, and the second active LED structure forms an electrical overstress protection structure that is electrically coupled for reverse biasing. The LED chip may further comprise: a first contact that is electrically connected at both the first n-type layer and the second p-type layer; and a second contact that is electrically connected at both the first p-type layer and the second n-type layer. In certain embodiments, at least a portion of the second active LED structure is arranged between the second contact and the first contact. The LED chip may further comprise a first metal layer arranged between the second contact and the second n-type layer, the first metal layer providing an increased contact resistance between the second contact and the second n-type layer. The LED chip may further comprise a second metal layer arranged between the first contact and the second p-type layer, the second metal layer providing an increased contact resistance between the first contact and the second p-type layer. In certain embodiments, the first n-type layer and the second n-type layer are discontinuous portions of a same n-type layer; the first p-type layer and the second p-type layer are discontinuous portions of a same p-type layer; and the first active layer and the second active layer are discontinuous portions of a same active layer.

The LED chip may further comprise a carrier submount that supports both the first active LED structure and the second active LED structure. In certain embodiments, the first p-type layer is arranged closer to the carrier submount than the first n-type layer, and the second p-type layer is arranged closer to the carrier submount than the second n-type layer. The LED chip may further comprise a reflective structure arranged between the first p-type layer and the carrier submount, the reflective structure comprising a dielectric reflective layer and a metal reflective layer. In certain embodiments, the metal reflective layer forms a plurality of reflective layer interconnects that extend through an entire thickness of the dielectric reflective layer to provide an electrical connection with the first p-type layer. The LED chip may further comprise a barrier layer that is arranged between the metal reflective layer and the carrier submount, wherein the barrier layer forms at least part of an electrical path between the first p-type layer and the second n-type layer. The LED chip may further comprise a plurality of second active LED structures that are electrically coupled in reverse relative to the first active LED structure. In certain embodiments, the plurality of second active LED structures are electrically coupled in series with one another. In certain embodiments, the plurality of second active LED structures are electrically coupled in parallel with one another. In certain embodiments, the LED chip may comprise a reverse breakdown voltage in a range from 10 volts to 50 volts.

In another aspect, an LED chip comprises: an n-type layer, a p-type layer, and an active layer arranged between the n-type layer and the p-type layer, a first active LED structure that comprises a first portion of the n-type layer, a first portion of the p-type layer, and a first portion of the active layer; a second active LED structure that comprises a second portion of the n-type layer, a second portion of the p-type layer, and a second portion of the active layer, the second active LED structure is discontinuous with the first active LED structure; an n-contact that is electrically coupled at both the first portion of the n-type layer of the first active LED structure and the second portion of the p-type layer of the second active LED structure; and a p-contact that is electrically coupled at both the first portion of the p-type layer of the first active LED structure and the second portion of the n-type layer of the second active LED structure. In certain embodiments, the first active LED structure forms a light-emitting structure that is electrically coupled for forward biasing, and the second active LED structure forms an electrical overstress protection structure that is electrically coupled for reverse biasing. In certain embodiments, at least a portion of the second active LED structure is arranged between the p-contact and the n-contact. The LED chip may further comprise a carrier submount that supports both the first active LED structure and the second active LED structure. The LED chip may further comprise a reflective structure arranged between the first portion of the p-type layer and the carrier submount, the reflective structure comprising a dielectric reflective layer and a metal reflective layer. In certain embodiments, the metal reflective layer forms a plurality of reflective layer interconnects that extend through an entire thickness of the dielectric reflective layer to provide an electrical connection with the first portion of the p-type layer. The LED chip may further comprise a barrier layer that is arranged between the metal reflective layer and the carrier submount, wherein the barrier layer forms at least part of an electrical path between the first portion of the p-type layer and the second portion of the n-type layer. The LED chip may further comprise a first metal layer arranged between the p-contact and the second portion of the n-type layer, the first metal layer providing an increased contact resistance between the p-contact and the second portion of the n-type layer. The LED chip may further comprise a second metal layer arranged between the n-contact and the second portion of the p-type layer, the second metal layer providing an increased contact resistance between the n-contact and the second portion of the p-type layer.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
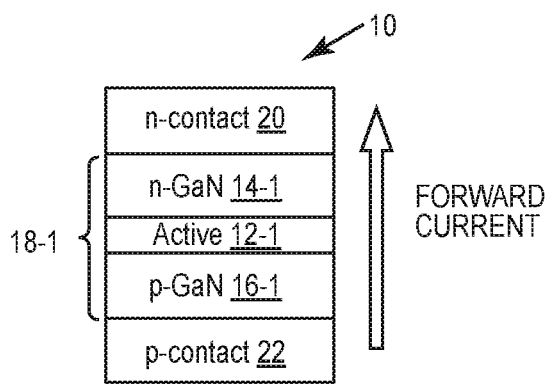
FIG. 1A is a cross-sectional view of a simplified light-emitting diode (LED) arrangement for a light-emitting structure that is electrically connected for forward biasing.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs) and more particularly to LED chip structures with electrical overstress protection. LED chip structures are disclosed that include built-in electrical overstress protection. An exemplary LED chip may include an active LED structure that is arranged as a primary light-emitting structure and a separate active LED structure that is arranged as an electrical overstress protection structure. The separate active LED structure that forms the electrical overstress protection structure may be electrically connected in reverse relative to the active LED structure that forms the primary light-emitting structure. In this manner, under normal operating conditions, forward current will flow through the primary light-emitting structure to generate desired light emissions and during an electrical overstress event, reverse current may flow through the electrical overstress protection structure, thereby protecting the primary light-emitting structure from damage.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In).

Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500K to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. In certain embodiments, a vertical geometry or lateral geometry LED chip may be configured as set forth in the commonly-assigned U.S. Pat. No. 9,461,201, which is hereby incorporated by reference herein. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, which is hereby incorporated by reference herein. In other embodiments, an active LED structure may be bonded to a carrier submount, and the growth substrate may be removed such that light may exit the active LED structure without passing through the growth substrate. In certain embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and 10,468,565.

According to aspects disclosed here, an LED chip is configured with in-device or built-in electrical overstress protection. In certain embodiments, an active LED structure of an LED chip is divided into at least two regions that are discontinuous from one another. A first region forms a light-emitting structure that is electrically connected for forward biasing and a second region forms an electrical overstress protection structure that is electrically connected in reverse relative to the light-emitting structure for reverse biasing. In this manner, under normal operating conditions, forward current through the light-emitting structure and generates desired light emissions for the LED chip, and during an electrical overstress event, reverse current may flow through the electrical overstress protection structure, thereby protecting the light-emitting structure from damage.

FIG. 1A is a cross-sectional view of a simplified LED arrangement for a light-emitting structure 10 that is electrically connected for forward biasing. The light-emitting structure 10 includes an active layer 12-1 that is arranged between an n-type GaN layer 14-1 and a p-type GaN layer 16-1 to form an active LED structure 18-1. An n-contact 20 is electrically coupled at the n-type GaN layer 14-1, and a p-contact 22 is electrically connected at the p-type GaN layer 16-1. In this manner, the light-emitting structure 10 is configured for forward biasing where current flows in a direction from the p-contact 22 (e.g., an anode) through the p-type GaN layer 16-1 to the n-type GaN layer 14-1 and the n-contact 20 (e.g., a cathode) as indicated by the upward oriented arrow in FIG. 1A. For a GaN-based active LED structure 18-1, forward current flow begins at a turn-on voltage that is typically in a range from 2.5 volts to 4 volts, or in a range from 2.8 volts to 3.6 volts in certain applications.

Figure 1B:
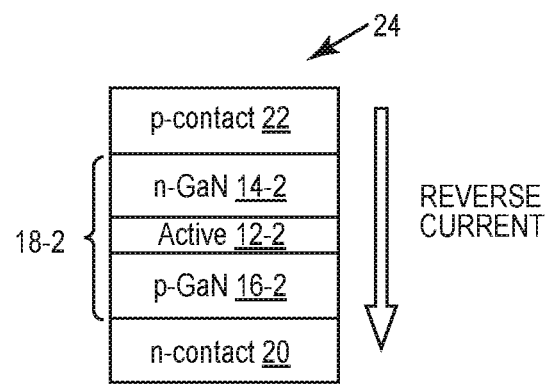
FIG. 1B is a cross-sectional view of a simplified LED arrangement for an electrical overstress protection structure that is electrically connected for reverse biasing.

FIG. 1B is a cross-sectional view of a simplified LED arrangement for an electrical overstress protection structure 24 that is electrically connected for reverse biasing. The electrical overstress protection structure 24 is configured the same as the light-emitting structure 10 of FIG. 1A, but with the reverse electrical coupling of the n-contact 20 and the p-contact 22. In this regard, the n-contact 20 is electrically coupled at a p-type GaN layer 16-2 and the p-contact 22 is electrically coupled at a n-type GaN layer 14-2. As such, an active LED structure 18-2 of FIG. 1B is configured for reverse biasing where current flows from the p-contact 22 (e.g., an anode) through the n-type GaN layer 14-2 to the p-type GaN layer 16-2 and the n-contact 20 (e.g., a cathode) as indicated by the downward oriented arrow in FIG. 1B. Under normal operating conditions, little or no current may flow through the active LED structure 18-2. If a reverse voltage exceeds a reverse breakdown voltage of the active LED structure 18-2, reverse current may flow. For ohmic contacts with a GaN-based active LED structure 18-2, the reverse breakdown voltage may be higher than the turn-on voltage, such as about 10 volts or higher, or in a range from 10 volts to 12 volts.

As described above, it is understood that additional layers and elements can also be included in the active LED structures 18-1, 18-2, including, but not limited to, buffer layers, nucleation layers, super lattice structures, un-doped layers, cladding layers, contact layers, and current-spreading layers and light extraction layers and elements. Active layers 12-1, 12-2 may comprise a single quantum well, a multiple quantum well, a double heterostructure, or super lattice structures. While the active LED structures 18-1, 18-2 are illustrated with GaN-based layers, the active LED structures 18-1, 18-2 can be fabricated from different material systems as described above.

Figure 2A:
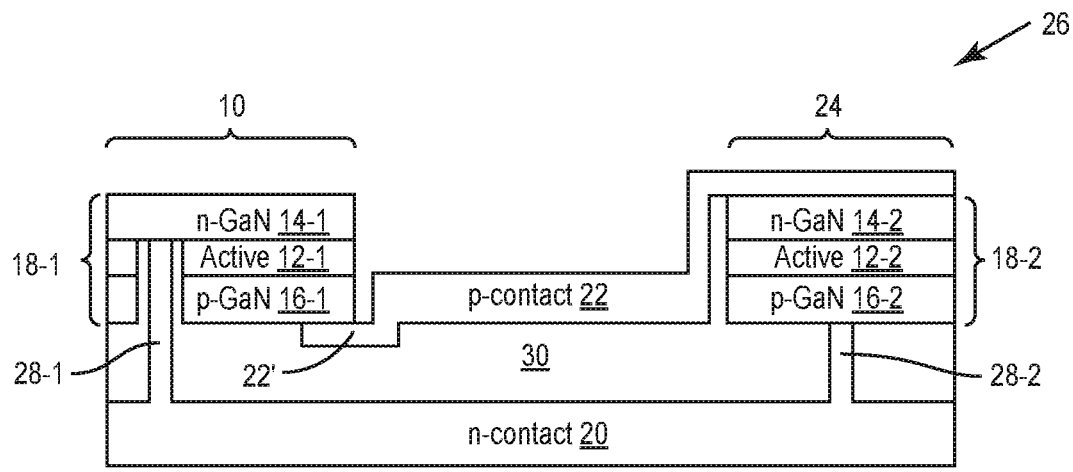
FIG. 2A is a cross-sectional illustration of an LED chip that includes both the light-emitting structure of FIG. 1A and the electrical overstress protection structure of FIG. 1B.

FIG. 2A is a cross-sectional illustration of an LED chip 26 that includes both the light-emitting structure 10 of FIG. 1A and the electrical overstress protection structure 24 of FIG. 1B. As illustrated, a first active LED structure 18-1 is discontinuous with a second active LED structure 18-2. In certain embodiments, the n-type GaN layer(s) 14-1, 14-2, the active layer(s) 12-1, 12-2, and the p-type GaN layer(s) 16-1, 16-2 may be formed in a continuous manner before portions of each are removed to form the discontinuous active LED structures 18-1, 18-2. In other embodiments, the first active LED structure 18-1 and the second active LED structure 18-2 may be formed separately from one another. As illustrated, the same n-contact 20 is electrically coupled at both the n-type GaN layer 14-1 of the light-emitting structure 10 and the p-type GaN layer 16-2 of the electrical overstress protection structure 24. The n-contact 20 may include n-contact interconnects 28-1, 28-2 that form electrically conductive paths that extend through at least one insulating layer 30. The at least one insulating layer 30 may include one or more dielectric layers. As further illustrated, the same p-contact 22 is electrically coupled at both the p-type GaN layer 16-1 of the light-emitting structure 10 and the n-type GaN layer 14-2 of the electrical overstress protection structure 24. In certain embodiments, an extension 22' of the p-contact 22 may be arranged between the p-type GaN layer 16-1 and the n-contact 20, and the extension 22' may extend at least partially through the at least one insulating layer 30. In certain embodiments, the extension 22' comprises a same material as the p-contact 22 while in other embodiments, the extension 22' comprises one or more electrically conductive materials that are different than the p-contact 22. In certain embodiments, the extension 22' comprises a barrier layer of electrically conductive material that will be further described below in greater detail. Under normal operating conditions, forward current will flow through the light-emitting structure 10 to generate light emissions at the turn-on voltage (e.g., 2.8 volts in one embodiment) of the active LED structure 18-1. If the LED chip 26 experiences an electrical overstress condition, such as an electrostatic discharge (ESD) event, that exceeds a breakdown voltage (e.g., >10 volts in one embodiment) of the active LED structure 18-2, reverse current will flow through the electrical overstress protection structure 24, thereby protecting the light-emitting structure 10 from damage.

By configuring the LED chip 26 with the electrical overstress protection structure 24 built-in or incorporated within the LED chip 26, the LED chip 26 may be provided with many advantages over conventional LED chips. For example, an LED package that includes the LED chip 26 may not require a separate ESD chip, thereby simplifying and reducing manufacturing costs associated with the LED package. Additionally, the built-in electrical overstress protection structure 24 may provide protection from electrical overstress events that may occur during handling of the LED chip 26 before it is incorporated into a package. While the illustrations of FIGS. 1A, 1B, and 2A are shown with GaN-based layers, other material systems such as SiC, organic semiconductor materials, and other Group III-V systems including GaP and GaAs may also be utilized without deviating from the principles disclosed.

Figure 2B:
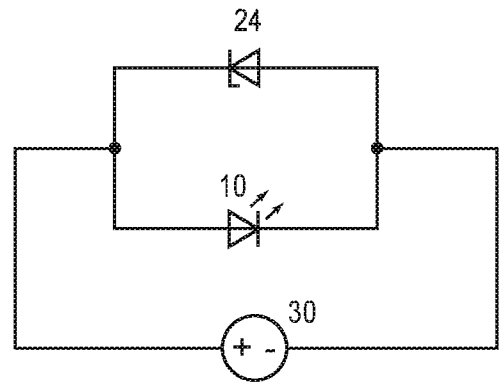
FIG. 2B illustrates a representative circuit diagram of the LED chip of FIG. 2A.

FIG. 2B illustrates a representative circuit diagram of the LED chip 26 of FIG. 2A. As described above, when connected to an external power source 31, forward current flows through the light-emitting structure 10 during normal operation and reverse current flows through the electrical overstress protection structure 24 when a breakdown voltage is exceeded.

Figure 3A:
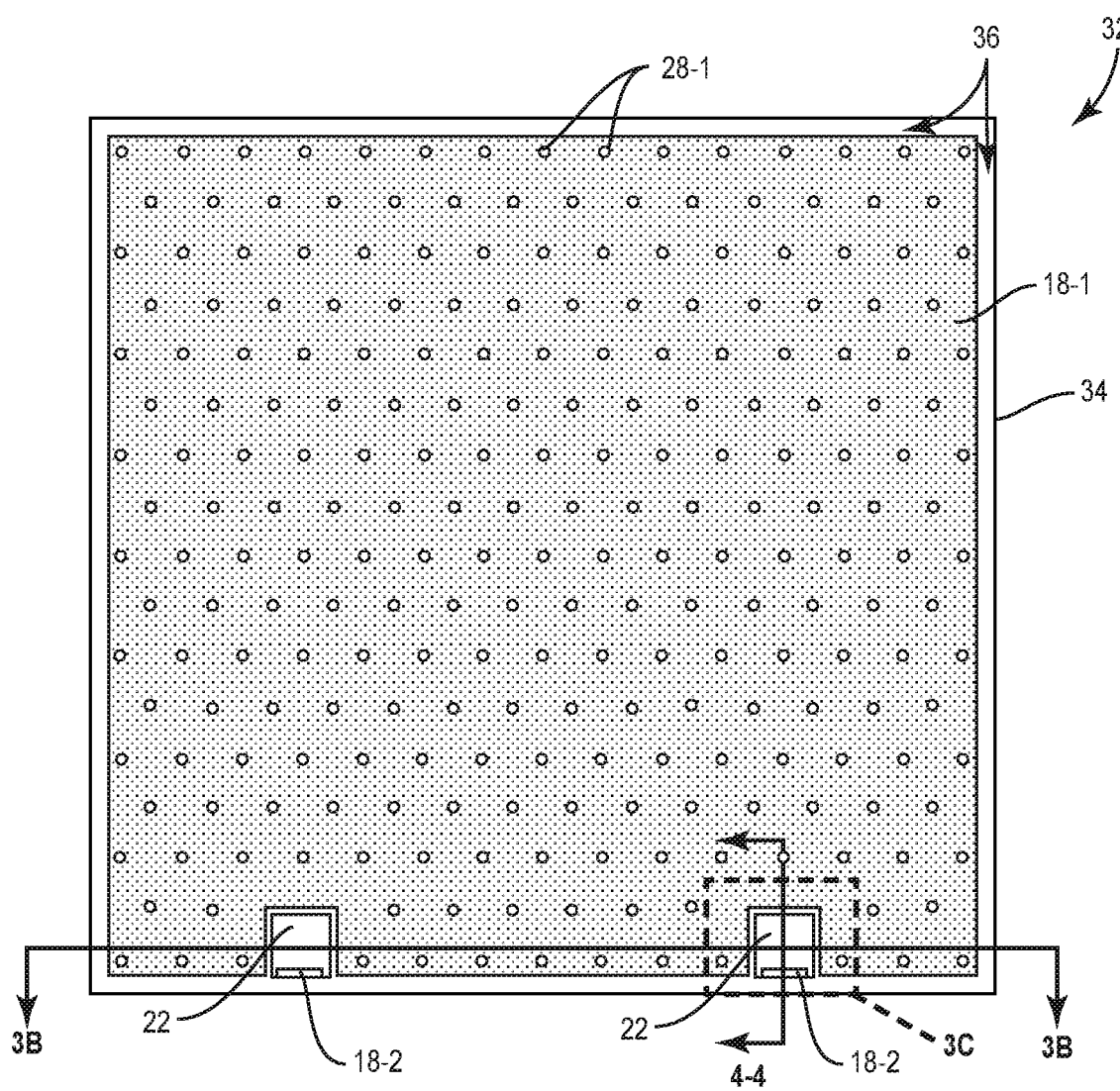
FIG. 3A is a top view illustration of a representative LED chip according to embodiments disclosed herein.
Figure 3B:
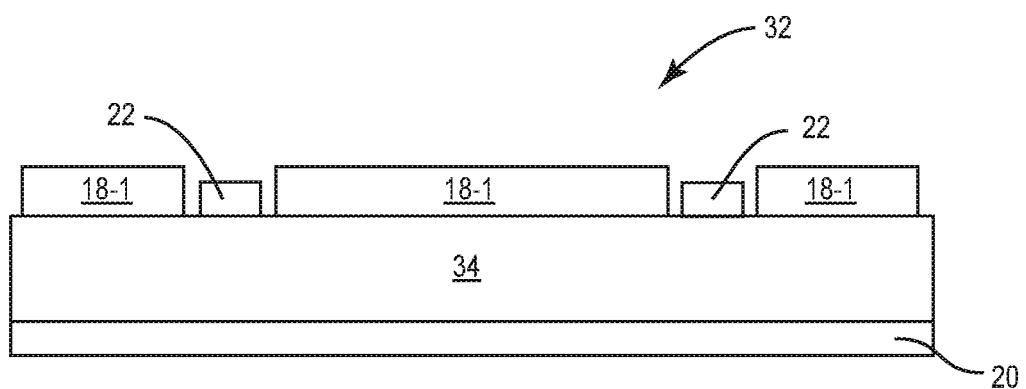
FIG. 3B is a general cross-sectional view of the LED chip taken along the sectional line 3B-3B of FIG. 3A.

In practice, LED chips may include many different configurations depending on the application. FIG. 3A is a top view illustration of a representative LED chip 32 according to embodiments disclosed herein. FIG. 3B is a general cross-sectional view of the LED chip 32 taken along the sectional line 3B-3B of FIG. 3A. The LED chip 32 includes the first active LED structure 18-1 and the second active LED structure 18-2 as described above. In FIG. 3A, the active LED structures 18-1, 18-2 are bonded to a carrier submount 34, and a growth substrate on which the active LED structures 18-1, 18-2 were initially formed has been removed. As such, the p-type layers of the active LED structures 18-1, 18-2 may be arranged closer to the carrier submount 34 than the n-type layers of the active LED structures 18-1, 18-2. The carrier submount 34 can be made of many different materials, with a suitable material being silicon. In certain embodiments, the carrier submount 34 comprises an electrically conductive material. As illustrated, the active LED structure 18-1 covers a substantial portion of the surface area of the carrier submount 34 to provide light emission for the LED chip 32. A peripheral border 36 of the carrier submount 34 may be formed that is devoid of the active LED structure 18-1.

The LED chip 32 may further include one or more p-contacts 22, or anodes, that are configured to provide an electrical connection at the p-type layer of the active LED structure 18-1. As illustrated, the p-contacts 22 are arranged at the peripheral border 36 in a region that is devoid of the active LED structure 18-1. While two p-contacts 22 are illustrated, the LED chip 32 may include a single p-contact 22 or more than two p-contacts 22 depending on a relative size of the LED chip 32. For example, a larger size or surface area of the LED chip 32 may generally correspond with an increase in a number of p-contacts 22 to provide increased current spreading. The second active LED structure 18-2 that forms the electrical overstress protection structure is provided between the p-contacts 22 and the carrier submount 34.

The LED chip 32 may comprise a plurality of the n-contact interconnects 28-1 that pass through portions of the active LED structure 18-1 to provide an electrical connection to the n-type layer of the active LED structure 18-1. The n-contact interconnects 28-1 may be provided at least partially within the active LED structure 18-1 and may be visible through the active LED structure 18-1 from the top view illustrated in FIG. 1A. As illustrated in FIG. 3A, a plurality of the n-contact interconnects 28-1 are provided across the active LED structure 18-1 to promote current spreading. The n-contact interconnects 28-1 are electrically connected to the n-contact 20, or cathode, that may be provided on an opposite face of the carrier submount 34 than the active LED structure 18-1 as illustrated in FIG. 3B. In this manner, the LED chip 32 is configured to be mounted to an LED package or fixture submount at the n-contact 20, and light may exit the LED chip 32 through the active LED structure 18-1 in a primary direction away from the carrier submount 34. After mounting to an LED package or fixture, the n-contact 20 may be electrically mounted and bonded to a first electrical connection (e.g., a cathode electrical trace) and the one or more p-contacts 22 may form bond pads for receiving an electrical connection (e.g., wirebond) to a second electrical connection (e.g., an anode electrical trace).

Figure 3C:
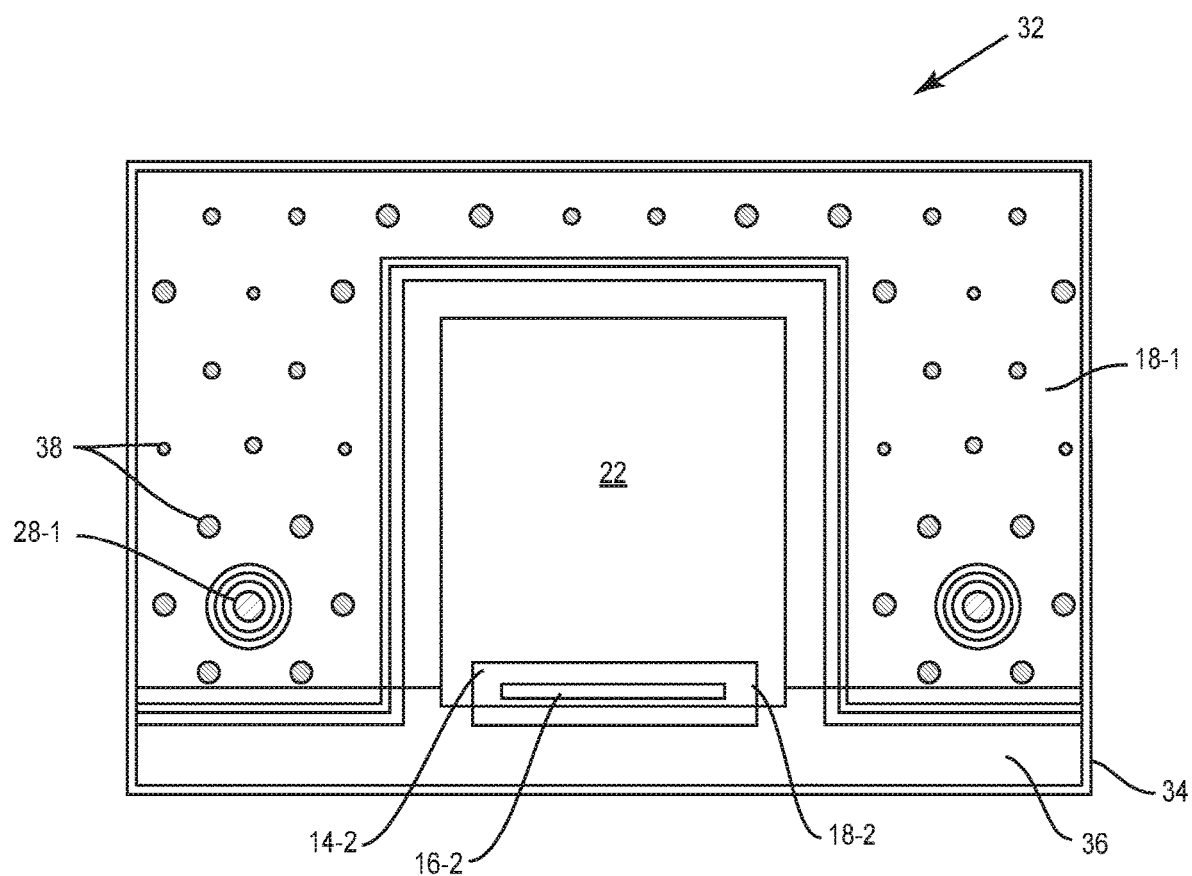
FIG. 3C is an expanded portion of the LED chip taken from the dashed-line box of FIG. 3A.

FIG. 3C is an expanded portion of the LED chip 32 taken from the dashed-line box of FIG. 3A. As illustrated, the p-contact 22 resides along the peripheral border 36 in an area that is devoid of the first active LED structure 18-1. In a similar manner to the LED chip 26 of FIG. 2A, the p-contact 22 is electrically connected to the p-type layer of the first active LED structure 18-1 in a position that is between the carrier submount 34 and the first active LED structure 18-1. As will be further described below in greater detail, a plurality of reflective layer interconnects 38, which may also be referred to as p-contact interconnects, are visible through the active LED structure 18-1 in the magnified view of FIG. 3C. Such reflective layer interconnects 38 may provide portions of electrically conductive paths between the p-contact 22 and the p-type layer of the first active LED structure 18-1. As illustrated, the reflective layer interconnects 38 are provided across the first active LED structure 18-1 to promote current spreading. Additionally, the reflective layer interconnects 38 may be formed with varying sizes or diameters to further promote current spreading and avoid regions of current crowding. The n-contact interconnects 28-1 are also visible through the first active LED structure 18-1 in FIG. 3C. The second active LED structure 18-2 is provided between the p-contact 22 and the carrier submount 34. In certain embodiments, the second active LED structure 18-2 is formed substantially smaller than the first active LED structure 18-1 so that as much of the LED chip 32 as possible is arranged as the light-emitting structure. In FIG. 3C, the second active LED structure 18-2 is provide with a length that is smaller than a width of the p-contact 22. Additionally, the second active LED structure 18-2 may be formed such that at least three peripheral edges of the second active LED structure 18-2 are at least partially covered by the p-contact 22. In FIG. 3C, the p-contact 22 does not cover one peripheral edge of the second active LED structure 18-2, although in other embodiments, the entire second active LED structure 18-2 may be covered without deviating from the principles disclosed herein. As will further be described in greater detail below, the p-type layer 16-2 of the second active LED structure 18-2 may be formed with a smaller overall area than the n-type layer 14-2 of the second active LED structure 18-2.

Figure 4:
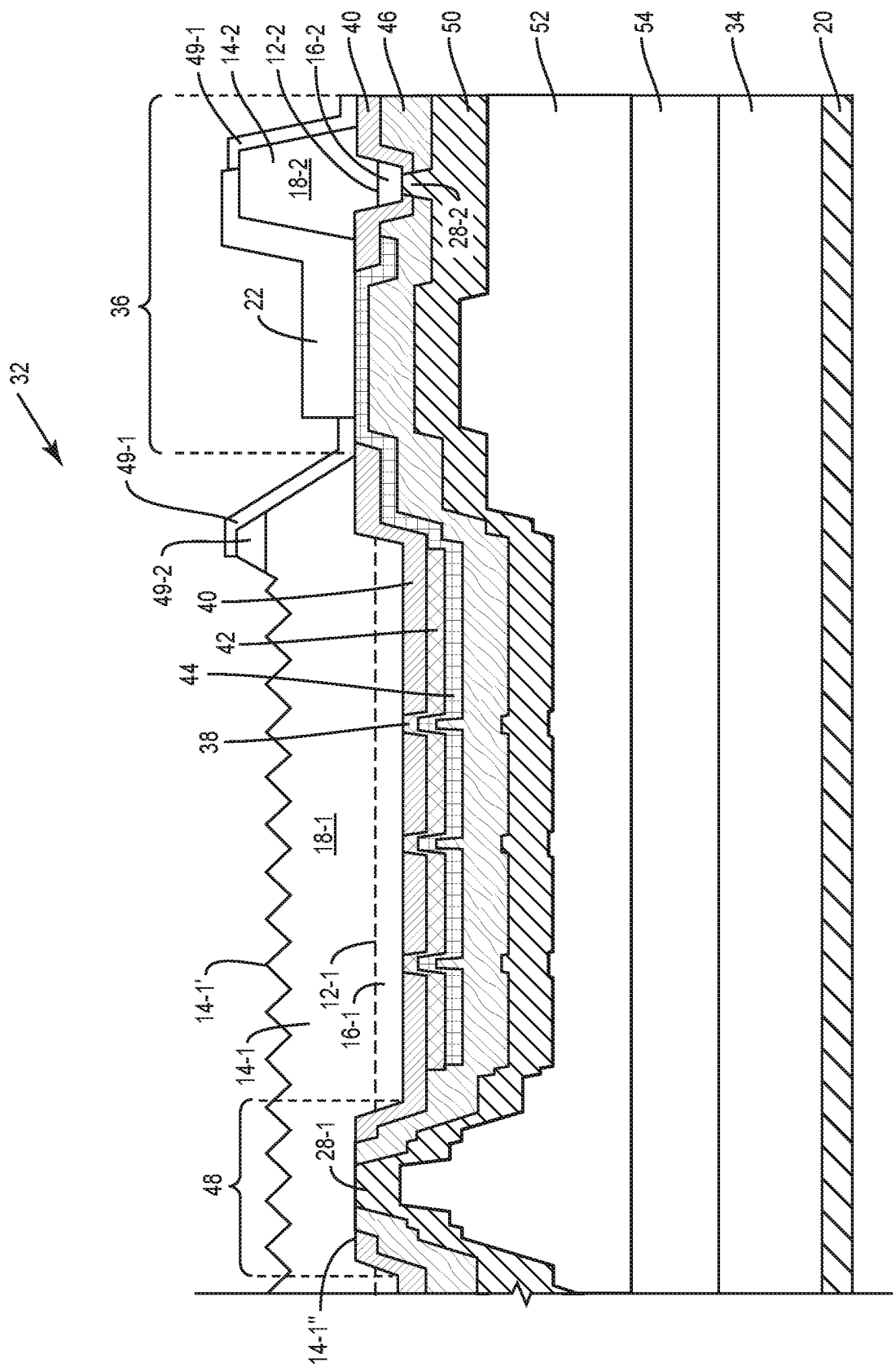
FIG. 4 is a partial cross-sectional view of the LED chip taken along the sectional line 4-4 of FIG. 3A.

FIG. 4 is a partial cross-sectional view of the LED chip 32 taken along the sectional line 4-4 of FIG. 3A. The active LED structure 18-1 of the LED chip 32 generally includes the p-type layer 16-1, the n-type layer 14-1, and the active layer 12-1 that is arranged therebetween. The active LED structure 18-2 generally includes the p-type layer 16-2, the n-type layer 14-2, and the active layer 12-2 that is arrange therebetween. As illustrated, the second active LED structure 18-2 is laterally spaced and discontinuous from the first active LED structure 18-1. The active LED structures 18-1, 18-2 may include many additional layers as previously described. In certain embodiments, the p-type layers 16-1, 16-2 are arranged between the active layers 12-1, 12-2 and the carrier submount 34 such that the p-type layers 16-1, 16-2 are closer to the carrier submount 34 than the n-type layers 14-1, 14-2. The active LED structures 18-1, 18-2 may initially be formed by epitaxially growing or depositing a continuous n-type layer, a continuous active layer and a continuous p-type layer sequentially on a growth substrate. The continuous layers may then be flipped and bonded to the carrier submount 34 and the growth substrate is removed. The separate active LED structures 18-1, 18-2 may then be formed by removing portions of each of the continuous n-type layer to form the separate n-type layers 14-1, 14-2, the continuous active layer to form the separate active layers 12-1, 12-2, and the continuous p-type layer to form the separate p-type layers 16-1, 16-2. In FIG. 4, the p-contact 22 resides at least partially in the space where the continuous layer portions were removed. The active LED structure 18-1 forms the light-emitting structure for the LED chip 32. As such, a top surface 14-1' of the n-type layer 14-1 may form a primary light-extracting face of the LED chip 32. In certain embodiments, the top surface 14-1' may comprise a textured or patterned surface for improving light extraction. In other embodiments, the doping order may be reversed such that n-type layers 14-1, 14-2 are arranged between the active layers 12-1, 12-2 and the carrier submount 34.

The LED chip 32 may include a first reflective layer 40 that is arranged on the p-type layer 16-1 such that the first reflective layer 40 is arranged between the p-type layer 16-1 and the carrier submount 34. In certain embodiments, a current spreading layer (not shown) may be provided between the p-type layer 16-1 and the first reflective layer 40. The current spreading layer may include a thin layer of a transparent conductive oxide such indium tin oxide (ITO) or a metal such as platinum (Pt), although other materials may be used. The first reflective layer 40 may comprise many different materials and preferably comprises a material that presents an index of refraction step with the material of the active LED structure 18-1 to promote total internal reflection (TIR) of light generated from the active LED structure 18-1. Light that experiences TIR is redirected without experiencing absorption or loss, and can thereby contribute to useful or desired LED chip emission. In certain embodiments, the first reflective layer 40 comprises a material with an index of refraction lower than the index of refraction of the active LED structure 18-1 material. The first reflective layer 40 may comprise many different materials, with some having an index of refraction less than 2.3, while others can have an index of refraction less than 2.15, less than 2.0, or less than 1.5. In certain embodiments, the first reflective layer 40 comprises a dielectric material to form a dielectric reflective layer, with some embodiments comprising silicon dioxide ($SiO_2$) and/or silicon nitride (SiN). As used herein, the general term "silicon nitride" and the abbreviation "SiN" generally refers to various silicon nitride compounds such as $SiN_x$, $Si_yN_x$, $Si_3N_4$, etc. It is understood that many dielectric materials can be used such as SiN, SiNx, $Si_yN_x$, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. In certain embodiments, the first reflective layer 40 may include multiple alternating layers of different dielectric materials, e.g., alternating layers of $SiO_2$ and SiN that symmetrically repeat or are asymmetrically arranged. Some Group III nitride materials such as GaN can have an index of refraction of approximately 2.4, and $SiO_2$ can have an index of refraction of approximately 1.48, and SiN can have an index of refraction of approximately 1.9. Embodiments with the active LED structure 18-1 comprising GaN and the first reflective layer 40 comprising $SiO_2$ can have a sufficient index of refraction step between the two to allow for efficient TIR of light. The first reflective layer 40 can have different thicknesses depending on the type of materials used, with some embodiments having a thickness of at least 0.2 microns (μm), or in a range from 0.2 μm to 0.7 μm, or in a range from 0.3 um to 0.6 um, or in a range from 0.4 μm to 0.6 μm.

The LED chip 32 may further include a second reflective layer 42 that is on the first reflective layer 40 such that the first reflective layer 40 is arranged between the active LED structure 18-1 and the second reflective layer 42. The second reflective layer 42 may include a metal layer that is configured to reflect light from the active LED structure 18-1 that may pass through the first reflective layer 40. The second reflective layer 42 may comprise many different materials such as Ag, gold (Au), Al, nickel (Ni), titanium (Ti) or combinations thereof. The second reflective layer 42 can have different thicknesses depending on the type of materials used, with some embodiments having a thickness of at least 0.1 μm, or in a range from 0.1 μm to 0.7 μm, or in a range from 0.1 um to 0.5 um, or in a range from 0.1 μm to 0.3 μm. As illustrated, the second reflective layer 42 may include one or more of the reflective layer interconnects 38 that provide an electrically conductive path through the first reflective layer 40. In this manner, the one or more reflective layer interconnects 38 may extend through an entire thickness of the first reflective layer 40. In certain embodiments, the second reflective layer 42 is a metal reflective layer and the reflective layer interconnects 38 comprise reflective layer metal vias. Accordingly, the first reflective layer 40, the second reflective layer 42, and the reflective layer interconnects 38 form a reflective structure of the LED chip 32 that is on the p-type layer 16-1 for reflecting and redirecting light generated by the active layer 12-1 toward the top surface 14-1'. As such, the reflective structure may comprise a dielectric reflective layer and a metal reflective layer as disclosed herein. In certain embodiments, the reflective layer interconnects 38 comprise the same material as the second reflective layer 42 and are formed at the same time as the second reflective layer 42. In other embodiments, the reflective layer interconnects 38 may comprise a different material than the second reflective layer 42. Some embodiments may also comprise an adhesion layer that is positioned at one or more interfaces between the first reflective layer 40 and the second reflective layer 42 to promote adhesion between the two. Many different materials can be used for the adhesion layer, such as titanium oxide (TiO, $TiO_2$), titanium oxynitride (TiON, $Ti_xO_yN$), tantalum oxide (TaO, $Ta_2O_5$), tantalum oxynitride (TaON), aluminum oxide (AlO, $Al_xO_y$) or combinations thereof, with a preferred material being TiON, AlO, or $Al_xO_y$. In certain embodiments, the adhesion layer comprises $Al_xO_y$, where 1≤x≤4 and 1≤y≤6. In certain embodiments, the adhesion layer comprises $Al_xO_y$, where x=2 and y=3, or $Al_2O_3$. The adhesion layer may be deposited by electron beam deposition that may provide a smooth, dense, and continuous layer without notable variations in surface morphology. The adhesion layer may also be deposited by sputtering, chemical vapor deposition, or plasma enhanced chemical vapor deposition.

The LED chip 32 may also comprise a barrier layer 44 (e.g., the extension 22' of FIG. 1C in certain embodiments) on the second reflective layer 42 to prevent migration of the second reflective layer 42 material, such as Ag, to other layers. Preventing this migration helps the LED chip 32 maintain efficient operation throughout its lifetime. The barrier layer 44 may comprise an electrically conductive material, with suitable materials including but not limited Ti, Pt, Ni, Au, tungsten (W), and combinations or alloys thereof. In certain embodiments, the barrier layer 44 is arranged to laterally extend beyond the active LED structure 18-1 to the peripheral border 36 in order to provide an electrical connection with the p-contact 22. In this regard, an electrical path between the p-contact 22 and the p-type layer 16-1 includes the barrier layer 44, the second reflective layer 42, and the reflective layer interconnects 38. A passivation layer 46 is included on the barrier layer 44 as well as any portions of the second reflective layer 42 that may be uncovered by the barrier layer 44. The passivation layer 46 protects and provides electrical insulation for the LED chip 32 and can comprise many different materials, such as a dielectric material. A suitable material for the passivation layer 46 includes, but is not limited to, silicon nitride. In some embodiments, the passivation layer 46 is a single layer, and in other embodiments, the passivation layer 46 comprises a plurality of layers. In certain embodiments, the passivation layer 46 may include one or more metal-containing interlayers arranged or embedded therein that may function as a crack stop layer for any cracks that may propagate through the passivation layer 46 as well as an additional light reflective layer.

In FIG. 4, the active LED structure 18-1 forms a first opening 48 or recess that extends through the p-type layer 16-1, the active layer 12-1, and a portion of the n-type layer 14-1. The first opening 48 may be formed by a subtractive material process, such as etching, that is applied to the active LED structure 18-1 before bonding with the carrier submount 34. In this manner, a first surface 14-1" of the n-type layer 14-1 is formed at a base of the first opening 48. As illustrated, a portion of the first reflective layer 40 is arranged to cover sidewall surfaces of the p-type layer 16-1, the active layer 12-1, and the n-type layer 14-1 within the first opening 48. The passivation layer 46 extends along the first reflective layer 40 in the first opening 48 and is arranged on the first surface 14-1" of the n-type layer 14-1. The LED chip 32 further includes an n-contact metal layer 50 that is arranged on the passivation layer 46 and across the LED chip 32. At the first opening 48, the n-contact metal layer 50 extends into the first opening 48 to form the n-contact interconnect 28-1, which may be referred to as an n-contact via. In this manner, the first opening 48 may be defined where portions of the n-contact metal layer 50, the n-contact interconnect 28-1, the passivation layer 46, and the first reflective layer 40 extend into the active LED structure 18-1. As such, the n-contact metal layer 50 and the n-contact interconnect 28-1 may be integrally formed to provide an electrical connection to the n-type layer 14-1 through the first opening 48. In other embodiments, the n-contact metal layer 50 and the n-contact interconnect 28-1 may be separately formed and may comprise the same or different materials. In certain embodiments, the n-contact metal layer 50 and the n-contact interconnect 28-1 comprise a single layer or a plurality of layers that include conductive metals, such as one or more of Al, Ti, and alloys thereof. The n-contact metal layer 50 may be electrically connected through the carrier submount 34 to the n-contact 20. In certain embodiments, the carrier submount 34 comprises an electrically conductive material. In other embodiments, the carrier submount 34 may comprises an electrically insulating material with one or more electrically conductive paths (e.g., electrical vias) formed through the carrier submount 34.

In order to facilitate bonding of the active LED structure 18-1 to the carrier submount 34, a first bonding metal layer 52 is provided on the n-contact metal layer 50 such that the first bonding metal layer 52 is arranged between the p-type layer 16-1 and the carrier submount 34. The first bonding metal layer 52 may include one or more layers of bond metals including, but not limited to, Au, Sn, Ni, palladium (Pd), Ti, W, and alloys thereof that are formed on the n-contact metal layer 50 before the active LED structure 18-1 is bonded to the carrier submount 34. In a similar manner, the carrier submount 34 is provided with a second bonding metal layer 54 that may include one or more layers of bond metals including, but not limited to, Au, Sn, Ni, Pd, Ti, W, and alloys thereof that are formed on the carrier submount 34 before bonding with the active LED structure 18-1. As illustrated, the first bonding metal layer 52 may conformally follow a contour or topography of the n-contact metal layer 50 along the active LED structure 18-1 and the first opening 48 as well as beyond the active LED structure 18-1 and along the peripheral border 36. At the start of bonding, the active LED structure 18-1 is arranged on the carrier submount 34 such that the first bonding metal layer 52 at least partially contacts the second bonding metal layer 54. During bonding, such as a eutectic bonding process, the first bonding metal layer 52 and the second bonding metal layer 54 are heated and may collectively form a continuous bonding material (e.g., one or more eutectic alloys) between the active LED structure 18-1 and the carrier submount 34. After bonding and removal of a growth substrate for the active LED structure 18-1, the top surface 14-1' of the n-type layer 14-1 may be textured or patterned. Additionally, the p-contact 22 may be formed on the barrier layer 44 and one or more top passivation layers 49-1, 49-2 may be provided on one or more top or side surfaces of the n-type layer 14-1. The top passivation layers 49-1, 49-2 may comprise separate layers or a continuous layer of dielectric material, such as silicon nitride.

As illustrated in FIG. 4, the second active LED structure 18-2 is formed in the peripheral border 36 and is discontinuous with the first active LED structure 18-1. The p-contact 22 is configured to extend along a sidewall of the n-type layer 14-2 and or along a top surface of the n-type layer 14-2 to provide an electrical contact to the n-type layer 14-2. In this regard, the p-contact 22 is electrically connected at both the n-type layer 14-2 of the second active LED structure 18-2 and the p-type layer 16-1 of the first active LED structure 18-1 by way of the barrier layer 44, the reflective layer interconnects 38, and the second reflective layer 42. In certain embodiments, a portion of the first reflective layer 40 (e.g., a dielectric such as $SiO_2$) is also provided along the p-type layer 16-2, the active layer 12-2, and portions of the n-type layer 14-2 to provide electrical isolation. The n-contact interconnect 28-2 is provided through the first reflective layer 40 and the passivation layer 46 to provide an electrical contact between the n-contact metal layer 50 and the p-type layer 16-2, and the n-contact metal layer 50 is electrically connected to the n-contact 20. In this regard, the second active LED structure 18-2 is arranged in a reverse bias configuration relative to the first active LED structure 18-1. As such, under normal operating conditions, forward current may flow through the first active LED structure 18-1 to generate desired light emissions for the LED chip 32 and during an electrical overstress event, reverse current may flow through the second active LED structure 18-2 that forms the electrical overstress protection structure, thereby protecting the first active LED structure 18-1 from damage. While the LED chip 32 is illustrated for a chip configuration that includes a carrier submount 34 and a growth substrate that has been removed, other embodiments may include configurations where a growth substrate is not removed. In such configurations, the LED chips may be arranged in a flip-chip configuration where the growth substrate forms a primary light-emitting face.

FIGS. 5A-12B illustrate fabrication steps for forming the second active LED structure 18-2 and the corresponding electrical overstress protection structure as illustrated in FIG. 4. Each pair of figures (i.e., 5A and 5B, 6A and 6B, 7A and 7B, 8A and 8B, 9A and 9B, 10A and 10B, 11A and 11B, 12A and 12B) represents a same fabrication step. Top view illustrations are provided by FIGS. 5A, 6A, 7A, 8A, 9A, 10A, 11A, and 12A that are taken from an expanded portion of the LED chip 32 in a similar position as the dashed-line box of FIG. 3A. Corresponding cross-sectional illustrations are provided by FIGS. 5B, 6B, 7B, 8B, 9B, 10B, 11B, and 12B. For illustrative purposes, the corresponding cross-sectional illustrations are shown with a same orientation relative the final structure as illustrated in FIG. 4, however actual orientations may be inverted in some figures (e.g., 5A-9B) as certain fabrication steps are performed to surfaces of the LED active structures before they are flipped and bonded to the carrier submount.

Figure 5A:
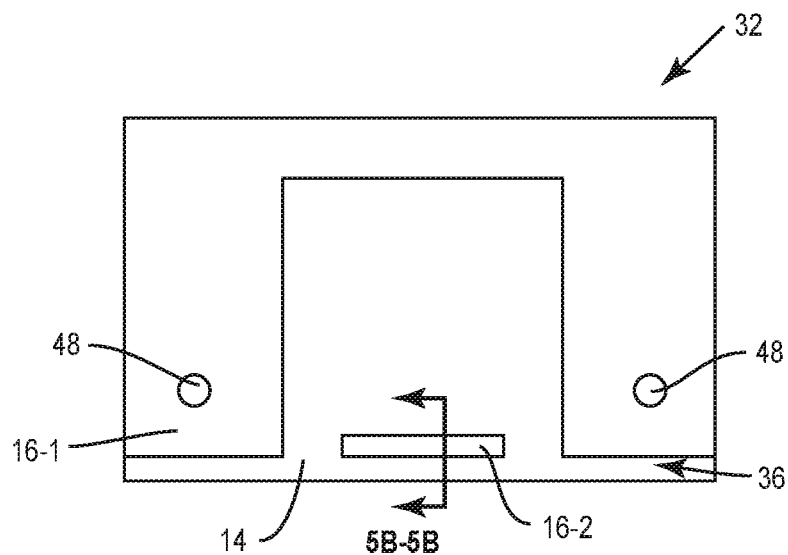
FIG. 5A is a top view of the LED chip after p-type layers are formed by removing portions of a continuous p-type layer.
Figure 5B:
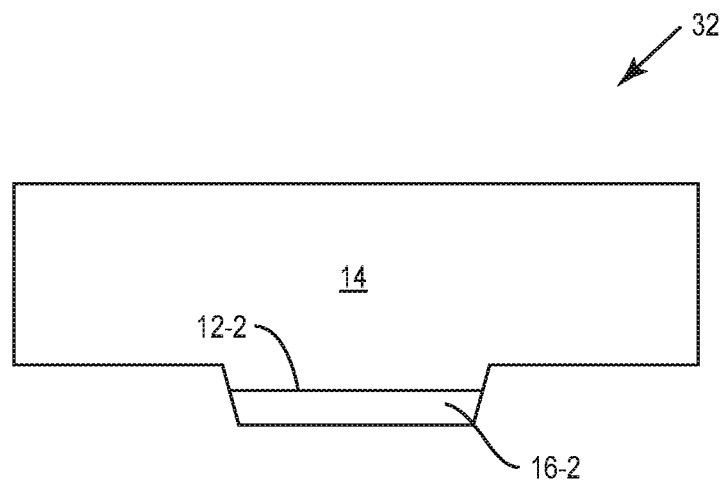
FIG. 5B is a cross-sectional view of a portion of the LED chip taken along the sectional line 5B-5B of FIG. 5A.

FIG. 5A is a top view of the LED chip 32 after the p-type layers 16-1, 16-2 are formed by removing portions of a continuous p-type layer. FIG. 5B is a cross-section taken along the sectional line 5B-5B of FIG. 5A. FIGS. 5A and 5B are illustrated with inverted orientation to correspond with the final structure of the LED chip 32 as illustrated in FIG. 4. As illustrated, portions of a continuous p-type layer and a continuous active layer have been completely removed to form the active layer 12-2 and the p-type layer 16-2 that will form part of the electrical overstress protection structure. Additionally, portions of a continuous n-type layer 14 have been partially removed. Such removal steps may be performed at a same fabrication step as when the p-type layer 16-1 is defined at the peripheral border 36 and the first openings 48 as previously described are formed. For illustrative purposes in FIG. 5A, the continuous n-type layer 14 is represented as transparent so that the p-type layers 16-1, 16-2 are visible in the top view orientation.

Figure 6A:
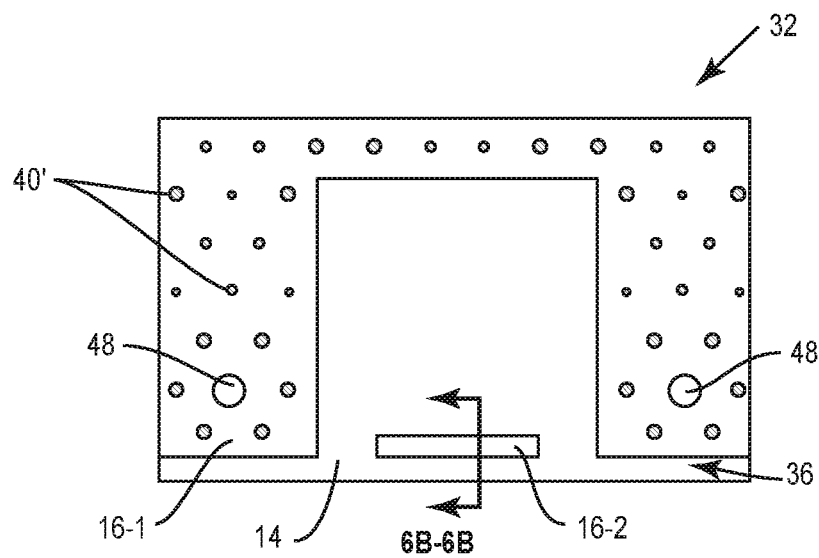
FIG. 6A is a top view of the LED chip after a first reflective layer is deposited.
Figure 6B:
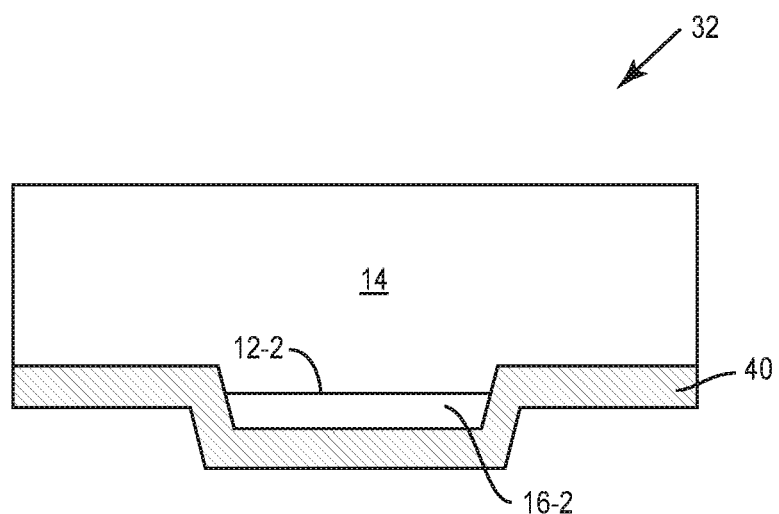
FIG. 6B is a cross-sectional view of a portion of the LED chip taken along the sectional line 6B-6B of FIG. 6A.

FIG. 6A is a top view of the LED chip 32 after the first reflective layer 40 is deposited. FIG. 6B is a cross-section taken along the sectional line 6B-6B of FIG. 6A. FIGS. 6A and 6B are illustrated with inverted orientation to correspond with the final structure of the LED chip 32 as illustrated in FIG. 4. The first reflective layer 40 is deposited across the LED chip 32, including on the p-type layers 16-1, 16-2, the active layer 12-2, and exposed portions of the n-type layer 14. In certain embodiments, portions of the first reflective layer 40 may be configured to extend at least partially into the first openings 48 as illustrated in FIG. 4. Additionally, reflective layer openings 40' may be formed in locations where the reflective layer interconnects (38 of FIG. 4) will be formed in a subsequent step. The first reflective layer 40 may cover side surfaces of the p-type layer 16-1 along the peripheral border 36 as best illustrated in FIG. 4.

Figure 7A:
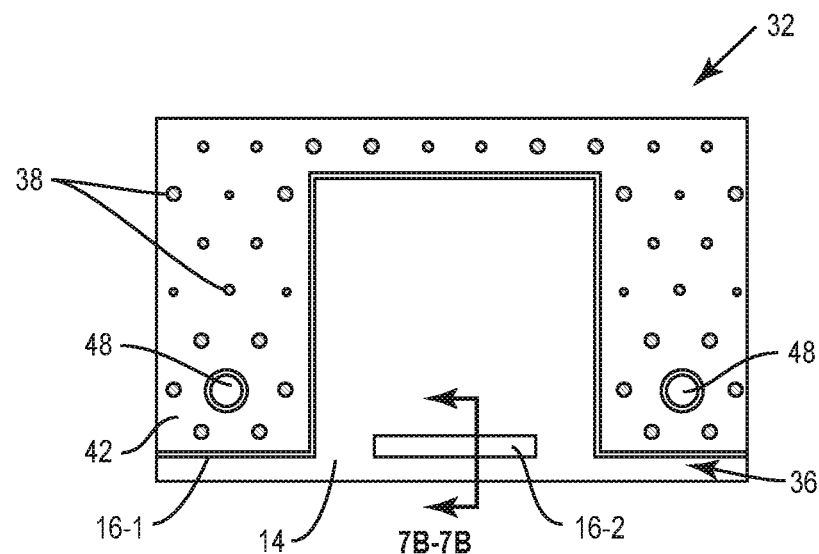
FIG. 7A is a top view of the LED chip after a second reflective layer is deposited on the first reflective layer.
Figure 7B:
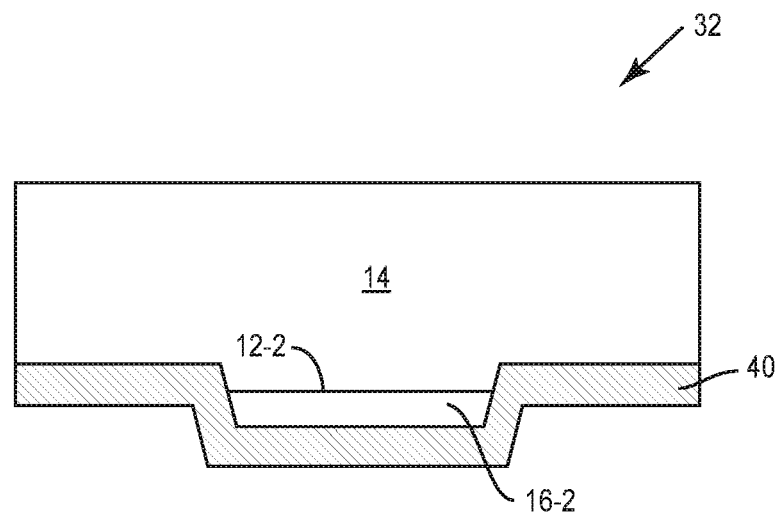
FIG. 7B is a cross-sectional view of a portion of the LED chip taken along the sectional line 7B-7B of FIG. 7A.

FIG. 7A is a top view of the LED chip 32 after the second reflective layer 42 is deposited on the first reflective layer 40. FIG. 7B is a cross-section taken along the sectional line 7B-7B of FIG. 7A. FIGS. 7A and 7B are illustrated with inverted orientation to correspond with the final structure of the LED chip 32 as illustrated in FIG. 4. The second reflective layer 42 is deposited on the first reflective layer 40 and within the reflective layer openings (40' of FIG. 6A) to form the reflective layer interconnects 38. As illustrated in FIG. 7B, the second reflective layer 42 may not be formed near the p-type layer 16-2 in certain embodiments.

Figure 8A:
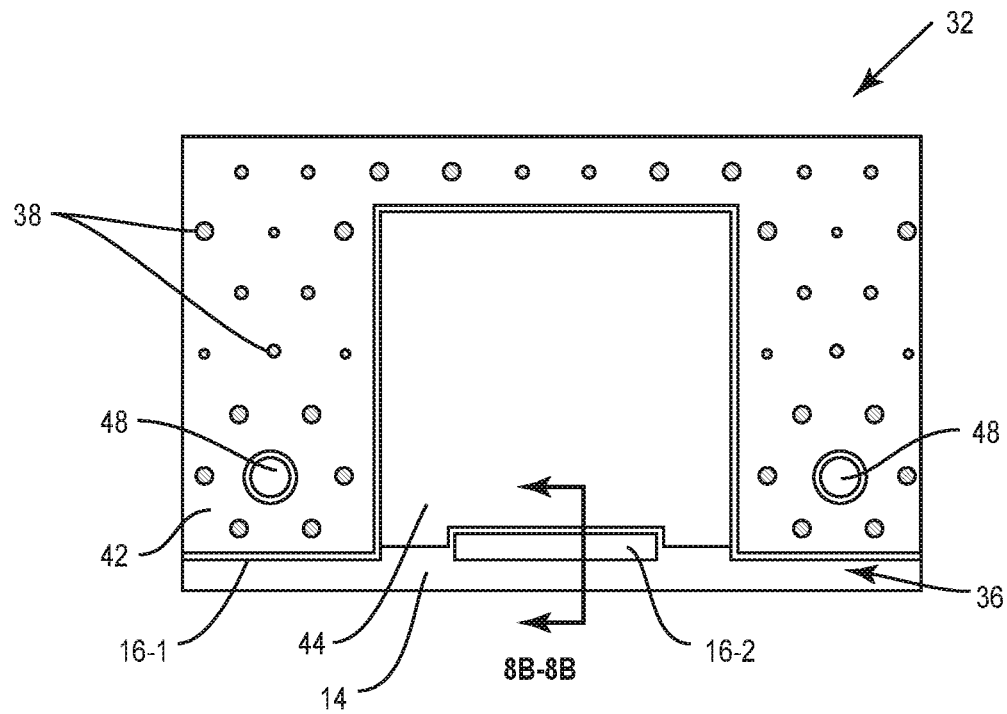
FIG. 8A is a top view of the LED chip after a barrier layer is formed on the second reflective layer.
Figure 8B:
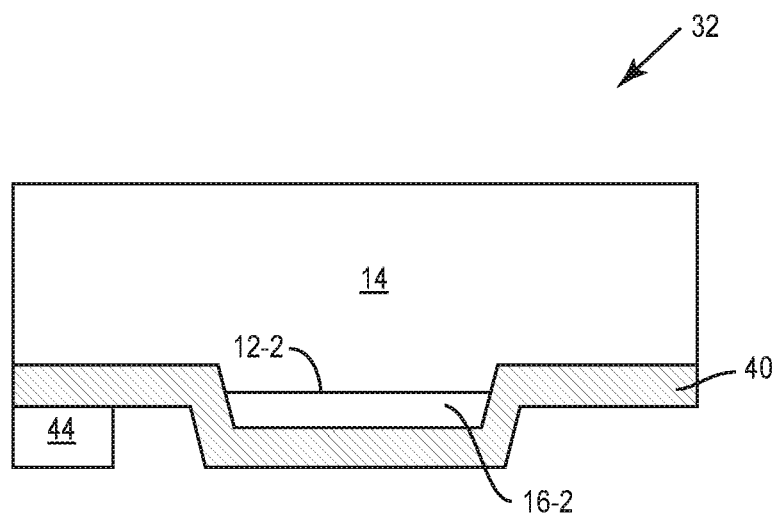
FIG. 8B is a cross-sectional view of a portion of the LED chip taken along the sectional line 8B-8B of FIG. 8A.

FIG. 8A is a top view of the LED chip 32 after the barrier layer 44 is formed on the second reflective layer 42. FIG. 8B is a cross-section taken along the sectional line 8B-8B of FIG. 8A. FIGS. 8A and 8B are illustrated with inverted orientation to correspond with the final structure of the LED chip 32 as illustrated in FIG. 4. As previously described, the barrier layer 44 may prevent migration of the second reflective layer 42 material to other portions of the LED chip 32. The barrier layer 44 may also form part of the electrically conductive path between the p-contact (22 of FIG. 4) and the p-type layer 16-1. As such, portions of the barrier layer 44 are formed where the p-contact (22 of FIG. 4) will subsequently reside. As illustrated in FIG. 8B, the barrier layer 44 may not be formed to extend to the p-type layer 16-2, and the barrier layer 44 may further be isolated from the p-type layer 16-2 by the first reflective layer 40.

Figure 9A:
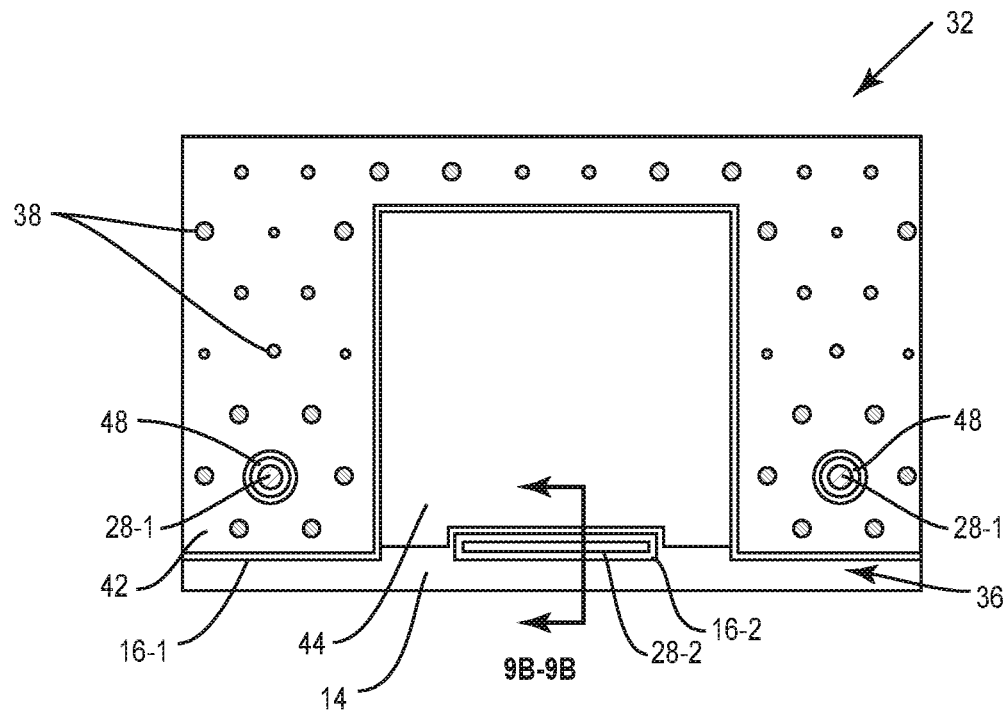
FIG. 9A is a top view of the LED chip after a passivation layer and an n-contact metal layer have been formed.
Figure 9B:
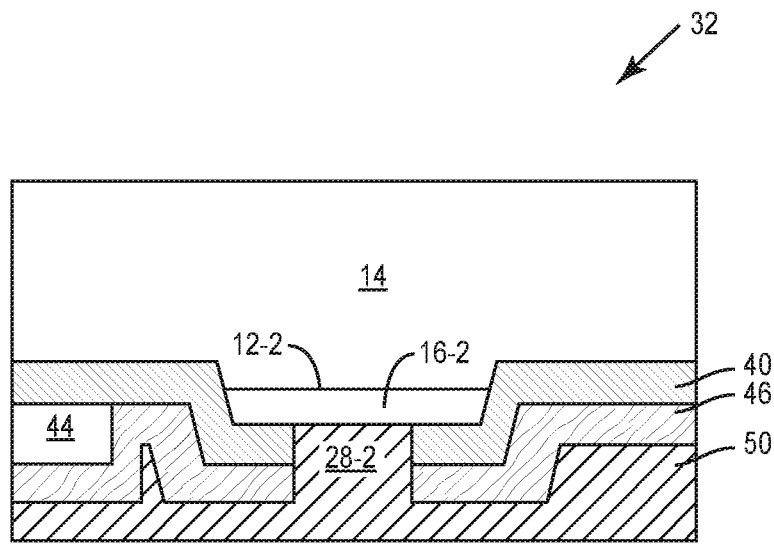
FIG. 9B is a cross-sectional view of a portion of the LED chip taken along the sectional line 9B-9B of FIG. 9A.

FIG. 9A is a top view of the LED chip 32 after the passivation layer 46 and the n-contact metal layer 50 have been deposited. FIG. 9B is a cross-section taken along the sectional line 9B-9B of FIG. 9A. FIGS. 9A and 9B are illustrated with inverted orientation to correspond with the final structure of the LED chip 32 as illustrated in FIG. 4. The n-contact metal layer 50 is deposited through the first openings 48 to form the n-contact interconnects 28-1. Additionally, the n-contact metal layer 50 forms the n-contact interconnect 28-2 that is electrically coupled at the p-type layer 16-2. As illustrated in FIG. 9B, the n-contact interconnect 28-2 is formed through the passivation layer 46 and the first reflective layer 40 to provide part of the reverse bias configuration to form electrical overstress protection structure. To form a path for the n-contact interconnect 28-2, portions of the passivation layer 46 and the first reflective layer 40 may be etched to expose a surface of the p-type layer 16-2. As previously described, a current spreading layer such as a transparent conductive oxide (e.g., ITO) may be provided on a surface of the p-type layer 16-2. In this regard, the current spreading layer may serve as an etch stop for etching of the passivation layer 46 and the first reflective layer 40. In certain embodiments, a second etch, such as a wet etch (e.g., HCL) may be applied to remove portions of the transparent conductive oxide to improve bonding and adhesion with the n-contact interconnect 28-2, particularly in embodiments where the n-contact interconnect 28-2 comprises Al.

Figure 10A:
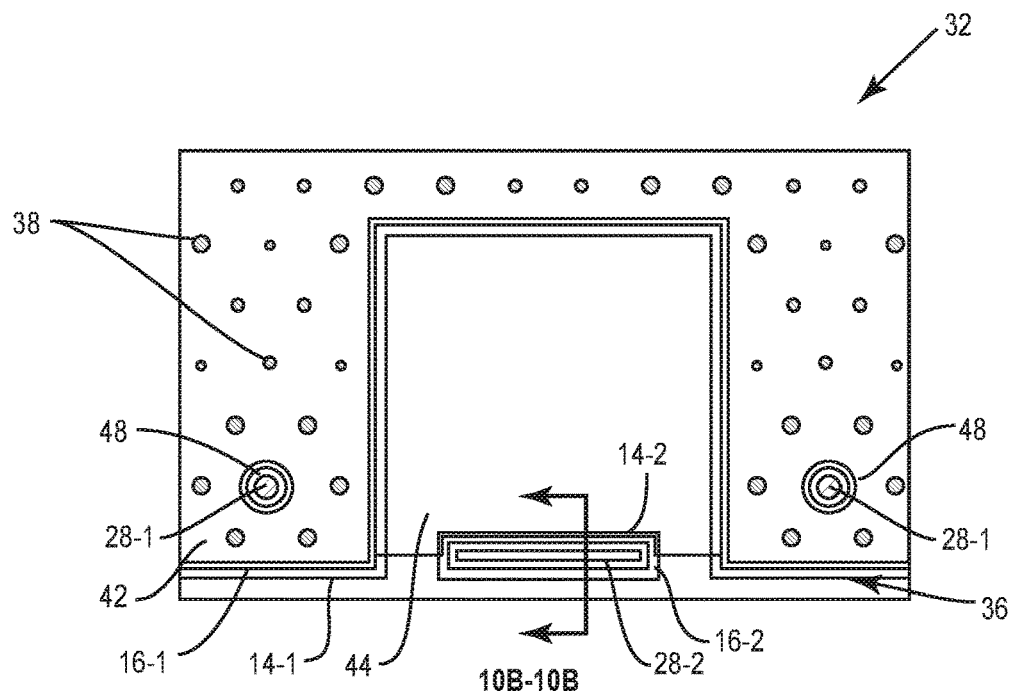
FIG. 10A is a top view of the LED chip after bonding with a carrier submount by way of a first bonding metal layer and a second bonding metal layer.
Figure 10B:
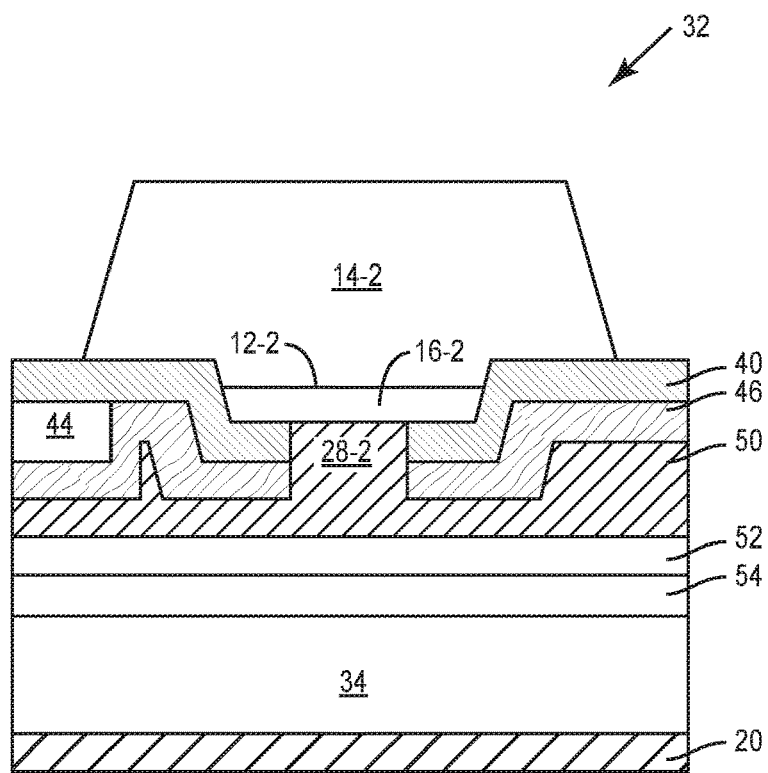
FIG. 10B is a cross-sectional view of a portion of the LED chip taken along the sectional line 10B-10B of FIG. 10A.

FIG. 10A is a top view of the LED chip 32 after bonding with the carrier submount 34 by way of the first bonding metal layer 52 and the second bonding metal layer 54. FIG. 10B is a cross-section taken along the sectional line 10B-10B of FIG. 10A. After flipping and bonding with the carrier submount 34, portions of the continuous n-type layer (14 of FIG. 9B) are removed along the peripheral border 36 to form a first n-type layer 14-1 and a second n-type layer 14-2 that are discontinuous with one another. The removal process may include one or more etching steps that leave angled sidewalls of the first and second n-type layers 14-1, 14-2, as best illustrated for the second n-type layer 14-2 in FIG. 10B. After bonding with the carrier submount 34, an electrically conductive path may be formed from the n-contact 20 to the p-type layer 16-2 as part of the reverse bias configuration to form the electrical overstress protection structure.

Figure 11A:
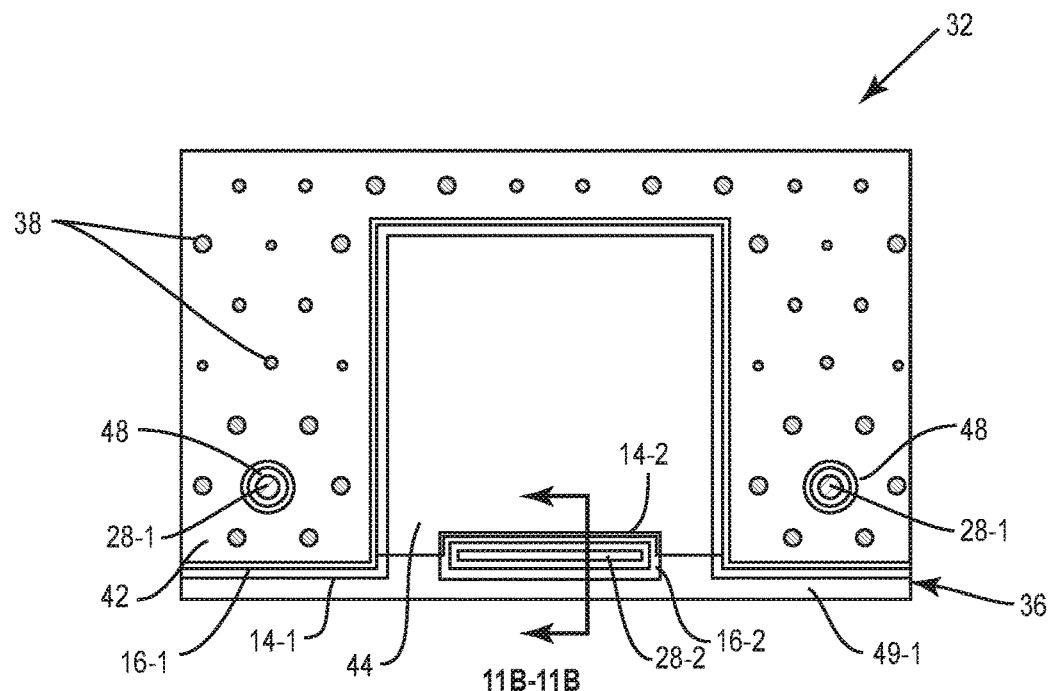
FIG. 11A is a top view of the LED chip after a top passivation layer is formed.
Figure 11B:
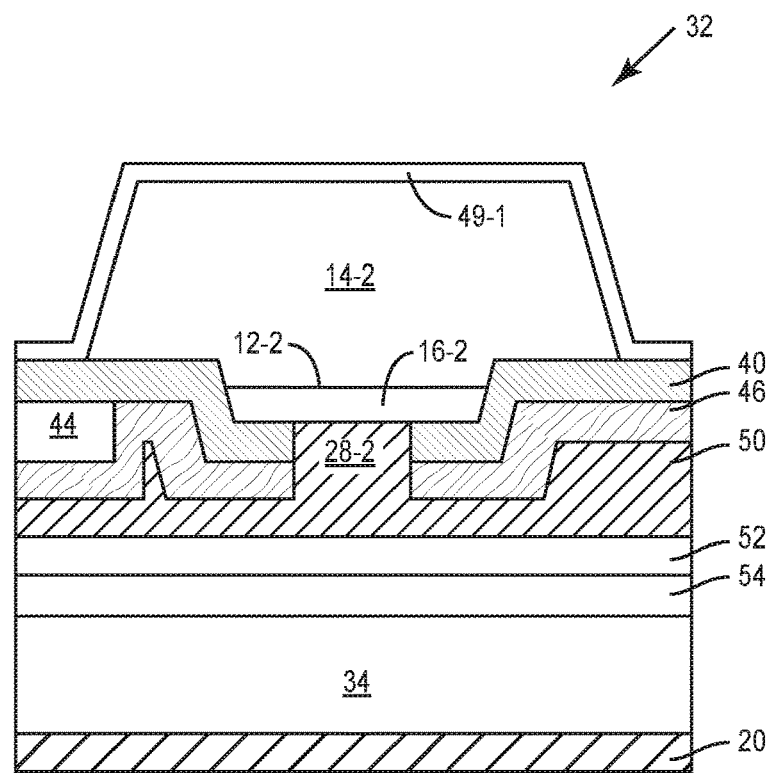
FIG. 11B is a cross-sectional view of a portion of the LED chip taken along the sectional line 11B-11B of FIG. 11A.

FIG. 11A is a top view of the LED chip 32 after the top passivation layer 49-1 is formed. FIG. 11B is a cross-section taken along the sectional line 11B-11B of FIG. 11A. The top passivation layer 49-1 is blanket-deposited over the LED chip 32, including over portions of the barrier layer 44 where the p-contact (22 of FIG. 4) will subsequently be formed. Additionally, the top passivation layer 49-1 is blanket-deposited over exposed portions of the second n-type layer 14-2.

Figure 12A:
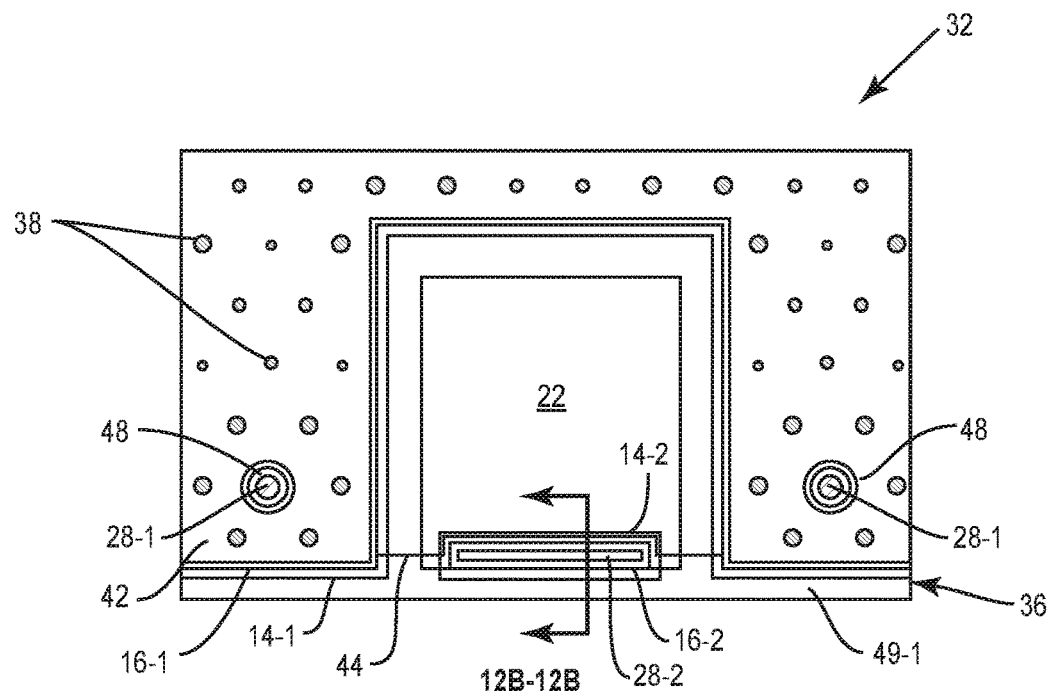
FIG. 12A is a top view of the LED chip after a p-contact has been formed.
Figure 12B:
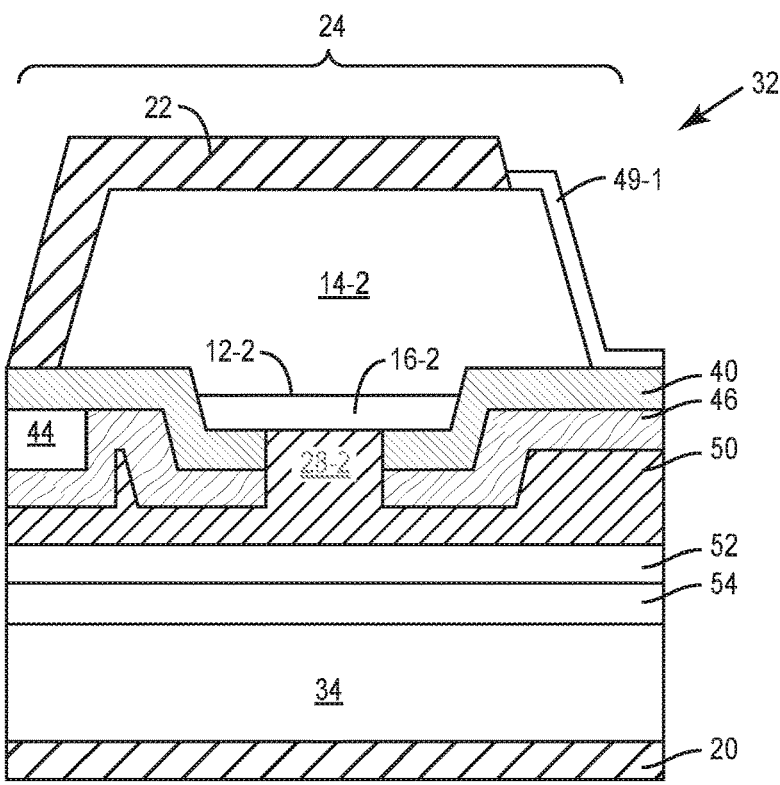
FIG. 12B is a cross-sectional view of a portion of the LED chip taken along the sectional line 12B-12B of FIG. 12A.

FIG. 12A is a top view of the LED chip 32 after the p-contact 22 has been formed. FIG. 12B is a cross-section taken along the sectional line 12B-12B of FIG. 12A. Before depositing the p-contact 22, portions of the top passivation layer 49-1 are removed, thereby allowing the p-contact 22 to be formed on and electrically connected with the barrier layer 44 as illustrated in FIG. 12A. As previously described, the barrier layer 44 provides an electrically conductive path between the p-contact 22 and the p-type layer 16-1. Additionally, portions of the top passivation layer 49-1 that are on the second n-type layer 14-2 are removed so that p-contact 22 may also be formed on and electrically connected to the second n-type layer 14-2. In this manner, the n-type layer 14-2, the active layer 12-2, and the p-type layer 16-2 are arranged in a reverse bias configuration to form the electrical overstress protection structure 24.

As disclosed herein, an LED chip with a built-in electrical overstress protection structure formed by a second LED active structure that is arranged in a reverse bias configuration relative to a first LED active structure provides a pathway for electrical surges to bypass a main light-emitting area of the LED chip. If a reverse voltage at the second LED active structure exceeds a reverse breakdown voltage of the second active LED structure, reverse current may accordingly flow through the second active LED structure and bypass the first active LED structure. As previously described, for ohmic contacts to GaN-based layers, the reverse breakdown voltage is typically in a range from 10 volts to about 12 volts. To achieve higher breakdown voltages, one or more additional metal layers having increased contact resistance may be provided between electrical contacts and the second active LED structure that increase electrical barriers and alter work functions of electrical contacts to the second active LED structure. In this regard, non-ohmic or Schottky barriers may be formed between electrical contacts and the second active LED structure, thereby providing higher reverse breakdown voltages. For GaN-based layers, reverse breakdown voltages may be increased as high as 20 volts or more in certain embodiments. The materials and/or thicknesses of the additional metal layers may be varied to provide different reverse breakdown voltages, thereby allowing different LED chips to be tuned to different reverse breakdown voltages. In this regard, the additional metal layers may also be referred to as modulation metal layers. As such, LED chips with built-in electrical overstress protection may comprise breakdown voltages in a range from 10 volts to 20 volts or more in various embodiments.

Figure 13:
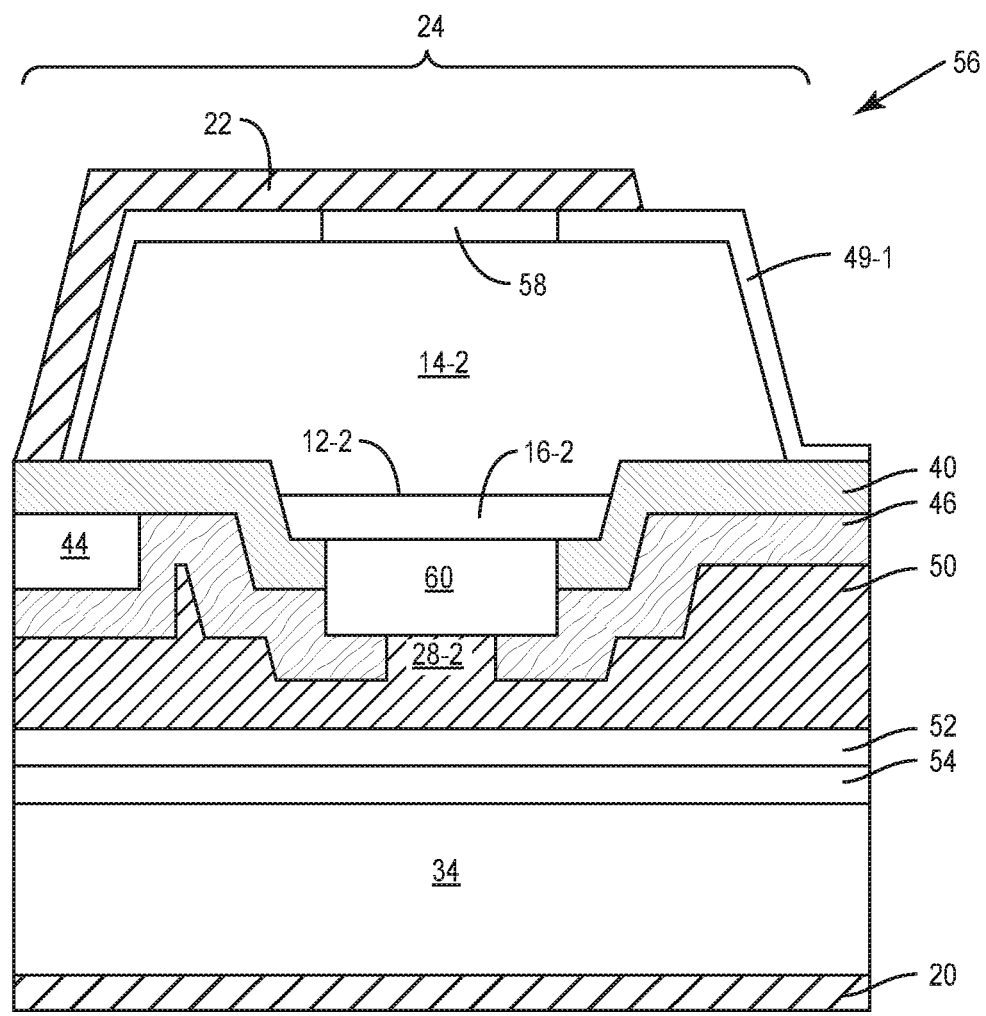
FIG. 13 is a cross-sectional view of an LED chip that is similar to the LED chip of FIG. 4 and taken from a similar portion as illustrated in FIG. 12B, and further includes one or more additional metal layers or metal modulation layers having increased contact resistance relative to the p-contact and the n-contact.

FIG. 13 is a cross-sectional view of an LED chip 56 that is similar to the LED chip 32 of FIG. 4 and taken from a similar portion as illustrated in FIG. 12B, and further includes one or more additional metal layers 58, 60 (or metal modulation layers) having increased contact resistance relative to the p-contact 22 and the n-contact 20. In certain embodiments, a first additional metal layer 58 is arranged in the electrical path between the p-contact 22 and the n-type layer 14-2. The first additional metal layer 58 may be deposited in an opening of the top passivation layer 49-1 before the p-contact 22 is formed. Notably, the top passivation layer 49-1 is formed on all exposed side and top surfaces of the n-type layer 14-2 outside of the first additional metal layer 58 to ensure the electrical path from the p-contact 22 to the n-type layer 14-2 passes through the first additional metal layer 58. The first additional metal layer 58 may comprise a higher contact resistance with the n-type layer 14-2 than a contact resistance between the p-contact 22 and the n-type layer 14-2. In certain embodiments, a second additional metal layer 60 may be arranged in the electrical path between the n-contact 20 and the p-type layer 16-2. As illustrated, the second additional metal layer 60 is positioned in an opening formed by the first reflective layer 40 and the passivation layer 46 so that the n-contact interconnect 28-2 may be electrically coupled with the second additional metal layer 60 through the passivation layer 46. The second additional metal layer 60 may comprise a higher contact resistance with the p-type layer 16-2 than a contact resistance between the n-contact 20 and/or the n-contact metal layer 50 and the p-type layer 16-2. In various configurations, the LED chip 56 may include the first additional metal layer 58, or the second additional metal layer 60, or both the first and second additional metal layers 58, 60. In certain embodiments, the first and second additional metal layers 58, 60 may comprise one more of Ti, Pt, Ni, and alloys thereof. Thickness of the first and second additional metal layers 58, 60 may be varied to provide different reverse breakdown voltages. As illustrated, the thickness of the second additional metal layer 60 may be thicker than the first additional metal layer 58 depending on the desired contact resistance. In other embodiments, the thicknesses may be reversed such that the first additional metal layer 58 is thicker than the second additional metal layer 60. Additionally, the first and second additional metal layers 58, 60 may have the same thickness.

Another way to increase the reverse breakdown voltage includes forming a plurality of reverse bias active LED structures in series to form a plurality of electrical overstress protection structures. For example, when four of the reversed biased structures as described are arranged in series, the reverse breakdown voltage will be additive for each structure, thereby providing a reverse breakdown voltage of 40 volts if each individual structure contributes 10 volts. More reversed biased structures in series would provide even higher reverse breakdown structures. In this regard, LED chips as disclosed herein may comprise reverse breakdown voltages in a range from 10 volts and 50 volts or more. In other embodiments, a plurality of the reverse bias active LED structures may be arranged in parallel with one another so that electrical overstress protection may continue if one of the reverse bias active LED structures fails or is otherwise damaged. Advantageously, the plurality of reverse bias active LED structures may be formed with a same number of fabrication (e.g., photolithography) steps as used for a single reverse bias active LED structure.

Figure 14A:
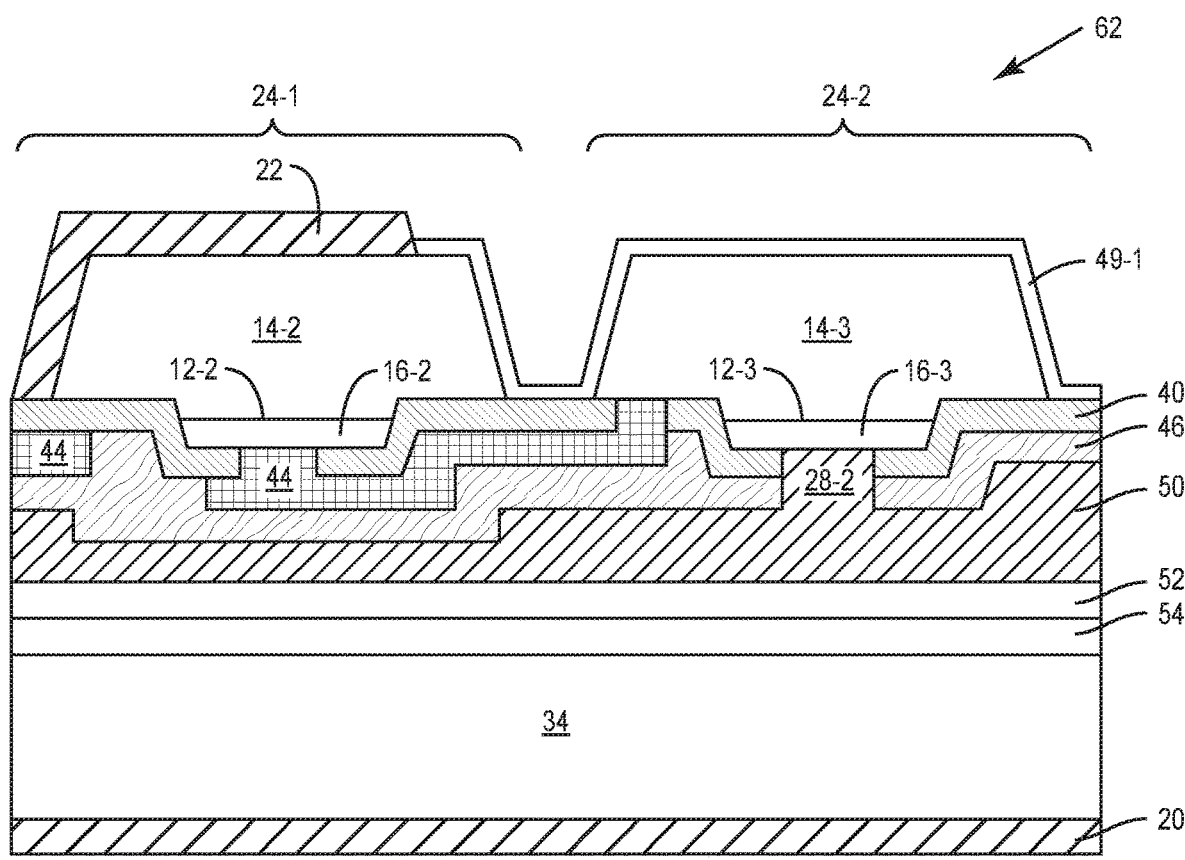
FIG. 14A is a cross-sectional view of an LED chip that is similar to the LED chip of FIG. 4 and taken from a similar portion as illustrated in FIG. 12B, and further includes a plurality of electrical overstress protection structures.

FIG. 14A is a cross-sectional view of an LED chip 62 that is similar to the LED chip 32 and taken from a similar portion as illustrated in FIG. 12B, and further includes a plurality of electrical overstress protection structures 24-1, 24-2. A first electrical overstress protection structure 24-1 is formed in similar manner as the electrical overstress protection structure 24 as illustrated in FIG. 12B, but an electrical path between the first electrical overstress protection structure 24-1 and the n-contact 20 now is arranged through a second electrical overstress protection structure 24-2. To accommodate this, a segment of the barrier layer 44 is arranged to provide an electrical connection between the p-type layer 16-2 of the first electrical overstress protection structure 24-1 and an n-type layer 14-3 of the second electrical overstress protection structure 24-2. The segment of the barrier layer 44 is arranged to extend between portions of the first reflective layer 40 and the passivation layer 46 to provide electrical isolation from other portions of the LED chip 62. Additionally, the top passivation layer 49-1 is arranged to partially cover the n-type layer 14-2 and completely cover the n-type layer 14-3. The n-contact interconnect 28-2 is accordingly arranged to provide an electrical connection between a p-type layer 16-3 of the second electrical overstress protection structure 24-2 and the n-contact metal layer 50 and the n-contact 20. In this manner the first and second electrical overstress protection structures 24-1, 24-2 are electrically connected in series. While two electrical overstress protection structures 24-1, 24-2 are illustrated in FIG. 14A, any number of electrical overstress protection structures may be provided to further increase a reverse breakdown voltage of the LED chip 62. In other embodiments, the plurality of the electrical overstress protection structures 24-1, 24-2 may be arranged in parallel with one another so that electrical overstress protection may continue if one of the electrical overstress protection structures 24-1, 24-2 fails or is otherwise damaged. In further embodiments, the plurality of electrical overstress protection structures 24-1, 24-2 may further comprise one or more additional metal layers having increased contact resistance as described above for the LED chip 56 of FIG. 13.

Figure 14B:
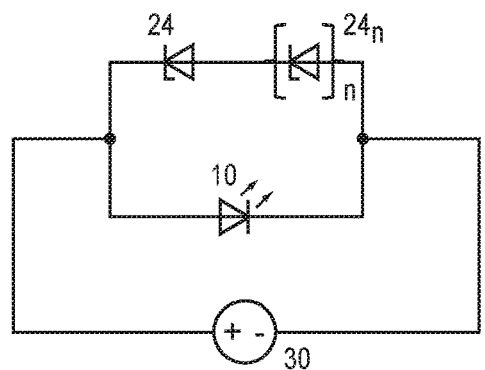
FIG. 14B illustrates a representative circuit diagram of the LED chip of FIG. 14A.

FIG. 14B illustrates a representative circuit diagram of the LED chip 62 of FIG. 14A. As described above, when connected to the external power source 31, forward current flows through the light-emitting structure 10 during normal operation and reverse current flows through the plurality of electrical overstress protection structures 24 ... 24$_n$ in series when a breakdown voltage is exceeded.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:
a first active LED structure that comprises a first n-type layer, a first p-type layer, and a first active layer;
a second active LED structure that comprises a second n-type layer, a second p-type layer, and a second active layer, wherein the second active LED structure is electrically coupled in reverse relative to the first active LED structure, and wherein the second active LED structure comprises a smaller area than the first active LED structure and the second active LED structure is formed in a peripheral border that is devoid of the first active LED structure;
a reflective structure arranged such that a first portion of the reflective structure is on the first p-type layer and a second portion of the reflective structure is arranged on the second p-type layer; and
a barrier layer arranged on and electrically coupled with the first portion of the reflective structure, wherein the barrier layer forms at least part of an electrical path between the first p-type layer and the second n-type layer, and a portion of the barrier layer is arranged to laterally extend away from the first portion of the reflective structure along a side surface of the first portion of the reflective structure and into the peripheral border.

2. The LED chip of claim 1, wherein the first active LED structure forms a light-emitting structure that is electrically coupled for forward biasing and the second active LED structure forms an electrical overstress protection structure that is electrically coupled for reverse biasing.

3. The LED chip of claim 1, further comprising:
a first contact that is electrically connected at both the first n-type layer and the second p-type layer; and
a second contact that is electrically connected at both the first p-type layer and the second n-type layer.

4. The LED chip of claim 3, wherein at least a portion of the second active LED structure is arranged between the second contact and the first contact.

5. The LED chip of claim 3, further comprising a first metal layer arranged between the second contact and the second n-type layer, the first metal layer providing an increased contact resistance between the second contact and the second n-type layer.

6. The LED chip of claim 5, further comprising a second metal layer arranged between the first contact and the second p-type layer, the second metal layer providing an increased contact resistance between the first contact and the second p-type layer.

7. The LED chip of claim 1, wherein:
the first n-type layer and the second n-type layer are discontinuous portions of a same n-type layer;

the first p-type layer and the second p-type layer are discontinuous portions of a same p-type layer; and the first active layer and the second active layer are discontinuous portions of a same active layer.

8. The LED chip of claim 1, further comprising a carrier submount that supports both the first active LED structure and the second active LED structure.

9. The LED chip of claim 8, wherein the first p-type layer is arranged closer to the carrier submount than the first n-type layer and the second p-type layer is arranged closer to the carrier submount than the second n-type layer.

10. The LED chip of claim 9, wherein the first portion of the reflective structure is arranged between the first p-type layer and the carrier submount, and the reflective structure comprises a dielectric reflective layer and a metal reflective layer, wherein the dielectric reflective layer is arranged in both the first and second portions of the reflective structure.

11. The LED chip of claim 10, wherein the metal reflective layer forms a plurality of reflective layer interconnects that extend through an entire thickness of the dielectric reflective layer at the first portion of the reflective structure to provide an electrical connection with the first p-type layer.

12. The LED chip of claim 11, wherein the barrier layer is arranged between the metal reflective layer and the carrier submount.

13. The LED chip of claim 1, further comprising a plurality of second active LED structures that are electrically coupled in reverse relative to the first active LED structure.

14. The LED chip of claim 13, wherein the plurality of second active LED structures are electrically coupled in series with one another.

15. The LED chip of claim 13, wherein the plurality of second active LED structures are electrically coupled in parallel with one another.

16. The LED chip of claim 1, further comprising a reverse breakdown voltage in a range from 10 volts to 50 volts.

17. A light-emitting diode (LED) chip, comprising:
an n-type layer, a p-type layer, and an active layer arranged between the n-type layer and the p-type layer,
a first active LED structure that comprises a first portion of the n-type layer, a first portion of the p-type layer, and a first portion of the active layer;
a second active LED structure that comprises a second portion of the n-type layer, a second portion of the p-type layer, and a second portion of the active layer, wherein the second active LED structure is discontinuous with the first active LED structure, and wherein the second active LED structure comprises a smaller area than the first active LED structure;
an n-contact that is electrically coupled at both the first portion of the n-type layer of the first active LED structure and the second portion of the p-type layer of the second active LED structure;
a p-contact that is electrically coupled at both the first portion of the p-type layer of the first active LED structure and the second portion of the n-type layer of the second active LED structure, wherein the p-contact directly contacts a side wall of the second portion of the n-type layer;
a top passivation layer on the first portion of the n-type layer of the first active LED structure, wherein the p-contact is arranged in an opening of the top passivation layer; and
a carrier submount that supports both the first active LED structure and the second active LED structure, wherein the n-contact and the p-contact are located on opposing faces of the carrier submount.

18. The LED chip of claim 17, wherein the first active LED structure forms a light-emitting structure that is electrically coupled for forward biasing and the second active LED structure forms an electrical overstress protection structure that is electrically coupled for reverse biasing.

19. The LED chip of claim 17, wherein at least a portion of the second active LED structure is arranged between the p-contact and the n-contact.

20. The LED chip of claim 17, further comprising a reflective structure arranged between the first portion of the p-type layer and the carrier submount, the reflective structure comprising a dielectric reflective layer and a metal reflective layer.

21. The LED chip of claim 20, wherein the metal reflective layer forms a plurality of reflective layer interconnects that extend through an entire thickness of the dielectric reflective layer to provide an electrical connection with the first portion of the p-type layer.

22. The LED chip of claim 21, further comprising a barrier layer that is arranged between the metal reflective layer and the carrier submount, wherein the barrier layer forms at least part of an electrical path between the first portion of the p-type layer and the second portion of the n-type layer.

23. The LED chip of claim 17, further comprising a first metal layer arranged between the p-contact and the second portion of the n-type layer, the first metal layer providing an increased contact resistance between the p-contact and the second portion of the n-type layer.

24. The LED chip of claim 23, further comprising a second metal layer arranged between the n-contact and the second portion of the p-type layer, the second metal layer providing an increased contact resistance between the n-contact and the second portion of the p-type layer.

25. The LED chip of claim 17, wherein the second active LED structure comprises a length that is less than a width of the p-contact.

* * * * *